(12) United States Patent
Son et al.

(10) Patent No.: US 11,251,724 B2
(45) Date of Patent: Feb. 15, 2022

(54) METHOD FOR CONTROLLING CURRENT PATH RANGE BY USING ELECTRIC FIELD, AND ELECTRONIC CIRCUIT

(71) Applicant: VMEMORY CORP., Suwon-si (KR)

(72) Inventors: Jong Hwa Son, Yongin-si (KR); Jong Yeog Son, Hwaseong-si (KR)

(73) Assignee: VMEMORY CORP., Suwon-si (KR)

( * ) Notice: Subject to any disclaimer, the term of this patent is extended or adjusted under 35 U.S.C. 154(b) by 0 days.

(21) Appl. No.: 17/273,162

(22) PCT Filed: Aug. 29, 2019

(86) PCT No.: PCT/KR2019/011060
§ 371 (c)(1),
(2) Date: Mar. 3, 2021

(87) PCT Pub. No.: WO2020/050549
PCT Pub. Date: Mar. 12, 2020

(65) Prior Publication Data
US 2021/0249975 A1    Aug. 12, 2021

(30) Foreign Application Priority Data
Sep. 4, 2018   (KR) .......................... 10-2018-0105315

(51) Int. Cl.
*H02H 3/00*   (2006.01)
*H02N 99/00*  (2006.01)
(52) U.S. Cl.
CPC .................................. *H02N 99/00* (2013.01)

(58) Field of Classification Search
None
See application file for complete search history.

(56) References Cited

U.S. PATENT DOCUMENTS 10,720,437 B2 *  7/2020  Yoo ..................... G11C 11/5657
2002/0018357 A1  2/2002  Oguchi et al.

FOREIGN PATENT DOCUMENTS

| JP | 2012-099720 A | 5/2012 |
| KR | 2006-0010785 A | 2/2006 |
| WO | 02-37500 A1 | 5/2002 |

OTHER PUBLICATIONS

International Search Report and Written Opinion dated Dec. 3, 2019 in International Patent Application No. PCT/KR2019/011060, filed Aug. 29, 2019, 12 pages.

(Continued)

*Primary Examiner* — Stephen W Jackson
(74) *Attorney, Agent, or Firm* — Kilpatrick Townsend & Stockton LLP

(57) ABSTRACT

A method of controlling a current path range using an electric field is disclosed, and the method of controlling a current path range includes applying an electric field to an active layer including a spontaneous polarization material through an application electrode disposed adjacent to the active layer to form a polarization region of the active layer, and forming a variable low resistance region corresponding to a boundary of the polarization region, wherein the variable low resistance region is a region of the active layer having a lower electrical resistance than another region of the active layer adjacent to the variable low resistance region and allows an electrical path to be formed.

29 Claims, 24 Drawing Sheets

(56) References Cited

OTHER PUBLICATIONS

McGilly, L.J., et al. "Controlling domain wall motion in ferroelectric thin films." Nature Nanotechnology, vol. 10, Issue 2 (2015), pp. 145-150, doi:10.1038/nnano.2014.320.
Notification of Reason for Refusal dated Sep. 23, 2019 in Korean Patent Application No. 20180105315, filed Sep. 4, 2018, 17 pages.
Written Decision on Grant of Patent dated May 28, 2020 in Korean Patent Application No. 20180105315, filed Sep. 4, 2018, 3 pages.

* cited by examiner

METHOD FOR CONTROLLING CURRENT PATH RANGE BY USING ELECTRIC FIELD, AND ELECTRONIC CIRCUIT

TECHNICAL FIELD

The present disclosure relates to a method of controlling a current path range using an electric field and a method of controlling a current path range of an electric circuit.

BACKGROUND ART

As technology has developed and the interest of people in the convenience of life is increased, the development of various electronic products has been actively attempted.

In addition, the electronic products are becoming smaller in size and highly integrated and are increasingly being used in a wide range of places.

Such electronic products include various electric elements, and, for example, include a central processing unit (CPU), a memory, and other various electric elements. The electric elements may include various types of electric circuits.

Electric elements are used, for example, not only in computers and smartphones but also in products in various fields, such as home sensor devices for Internet of Things (IoT) and bioelectronic devices for ergonomics.

Meanwhile, in recent years, as the speed of technology development has increased and the living standards of users have rapidly improved, the use and application fields of the electric elements are rapidly expanded, and the demand for the electric elements is also increasing accordingly.

Due to this trend, there is a limitation in implementing and controlling electric circuits that are easily and rapidly applicable to various commonly used electric elements.

DESCRIPTION OF EMBODIMENTS

Technical Problem

The present disclosure is directed to providing a method of controlling a current path range and an electric circuit, which are easily applicable to various applications.

Solution to Problem

One aspect of the present disclosure provides a method of controlling a current path range using an electric field is disclosed, the method including applying an electric field to an active layer including a spontaneous polarization material through an application electrode disposed adjacent to the active layer to form a polarization region of the active layer, and forming a variable low resistance region corresponding to a boundary of the polarization region, wherein the variable low resistance region is a region of the active layer having a lower electrical resistance than another region of the active layer adjacent to the variable low resistance region and allows an electrical path to be formed.

In an embodiment, the forming of the variable low resistance region may include growing the polarization region of the active layer in a thickness direction of the active layer, and growing the polarization region in a direction crossing the thickness direction of the active layer.

In an embodiment, the electric field through the application electrode may be controlled to control the generation and disappearance of the variable low resistance region and accordingly to control the generation and disappearance of the electrical path.

In an embodiment, the forming of the variable low resistance region may include applying the electric field having an intensity greater than a coercive field of the active layer through the application electrode.

In an embodiment, the forming of the variable low resistance region, an intensity of the electric field through the application electrode may be controlled to control a depth of the variable low resistance region in a thickness direction of the active layer.

In an embodiment, the forming of the variable low resistance region, the variable low resistance region may be formed to be spaced apart from the application electrode with a distance in a plane direction of the active layer.

In an embodiment, the forming of the variable low resistance region, an application time of the electric field through the application electrode may be controlled to control a size or width of the variable low resistance region.

In an embodiment, the forming of the variable low resistance region may include forming a plurality of variable low resistance regions disposed to be spaced apart from each other.

In an embodiment, in the forming of the plurality of variable low resistance regions, a variable low resistance region disposed farther from the application electrode first is formed, and then, a variable low resistance region disposed closer to the application electrode is formed.

In an embodiment, the forming of the plurality of variable low resistance regions may be performed such that polarization regions having different directions are located on opposite sides of one variable low resistance region with the one variable low resistance region as a boundary.

In an embodiment, the application electrode may be provided in plural numbers spaced apart from each other, and the method may include forming polarization regions, which are spaced apart from at least one region, in the active layer through the plurality of application electrodes and forming a plurality of variable low resistance regions corresponding to the polarization regions.

In an embodiment, the method may include, by controlling an application time of the electric field applied through the application electrode, overlapping the plurality of polarization regions, which are spaced apart from each other, in one region, and integrating regions of the plurality of variable low resistance regions corresponding thereto by overlapping each other.

In an embodiment, the method may include forming at least one connection electrode to be adjacent to the variable low resistance region.

In an embodiment, even when the electric field applied through the application electrode is removed, the variable low resistance region may be maintained as the polarization region is maintained.

Another aspect of the present disclosure provides an electric circuit including an active layer comprising a spontaneous polarization material, an application electrode disposed adjacent to the active layer, a polarization region formed in the active layer by applying an electric field to the active layer through the application electrode, and a variable low resistance region corresponding to a boundary of the polarization region, wherein the variable low resistance region is a region of the active layer having a lower electrical resistance than another region of the active layer adjacent to the variable low resistance region and allows an electrical path to be formed.

In an embodiment, the variable low resistance region may be generated or disappeared by controlling the electric field applied through the application electrode and accordingly controlling the polarization region.

In an embodiment, an intensity of the electric field through the application electrode may be controlled to control a depth of the variable low resistance region in a thickness direction of the active layer.

In an embodiment, an application time of the electric field through the application electrode may be controlled to control a size or width of the variable low resistance region.

In an embodiment, the variable low resistance region may include a plurality of variable low resistance regions disposed to be spaced apart from each other.

From among the plurality of variable low resistance regions, a variable low resistance region disposed farther from the application electrode first is formed, and then, a variable low resistance region disposed closer to the application electrode is formed.

In an embodiment, polarization regions having different directions may be formed on opposite sides of one variable low resistance region of the plurality of variable low resistance regions with the one variable low resistance region as a boundary.

In an embodiment, the application electrode may be provided in plural numbers spaced apart from each other.

In an embodiment, the electric circuit may include a plurality of polarization regions and a plurality of variable low resistance regions, which are corresponding to the plurality of application electrodes spaced apart from each other.

In an embodiment, by controlling an application time of the electric field applied through the application electrode, the plurality of polarization regions, which are spaced apart from each other, overlap in one region, and regions of the plurality of variable low resistance regions corresponding thereto are integrated by overlapping each other.

In an embodiment, the electric circuit may further include at least one connection electrode formed adjacent to the variable low resistance region.

In an embodiment, the active layer may include a ferroelectric material. In an embodiment, the application electrode may be formed on one surface of the active layer.

In an embodiment, the application electrode may be disposed to be spaced apart from the active layer.

In an embodiment, the variable low resistance region may be maintained even when the electric field applied through the application electrode is removed.

In an embodiment, the variable low resistance region may be formed in the periphery of the application electrode.

In an embodiment, the variable low resistance region may be formed to have a linear shape in the periphery of the application electrode.

Other aspects, features, and advantages other than the above-described features will be apparent from the following drawings, claims, and detailed descriptions of the disclosure.

Advantageous Effects

A method of controlling a current path range and an electric circuit according to the present disclosure can be easily applied to various applications.

MODES OF DISCLOSURE

Figure 1:
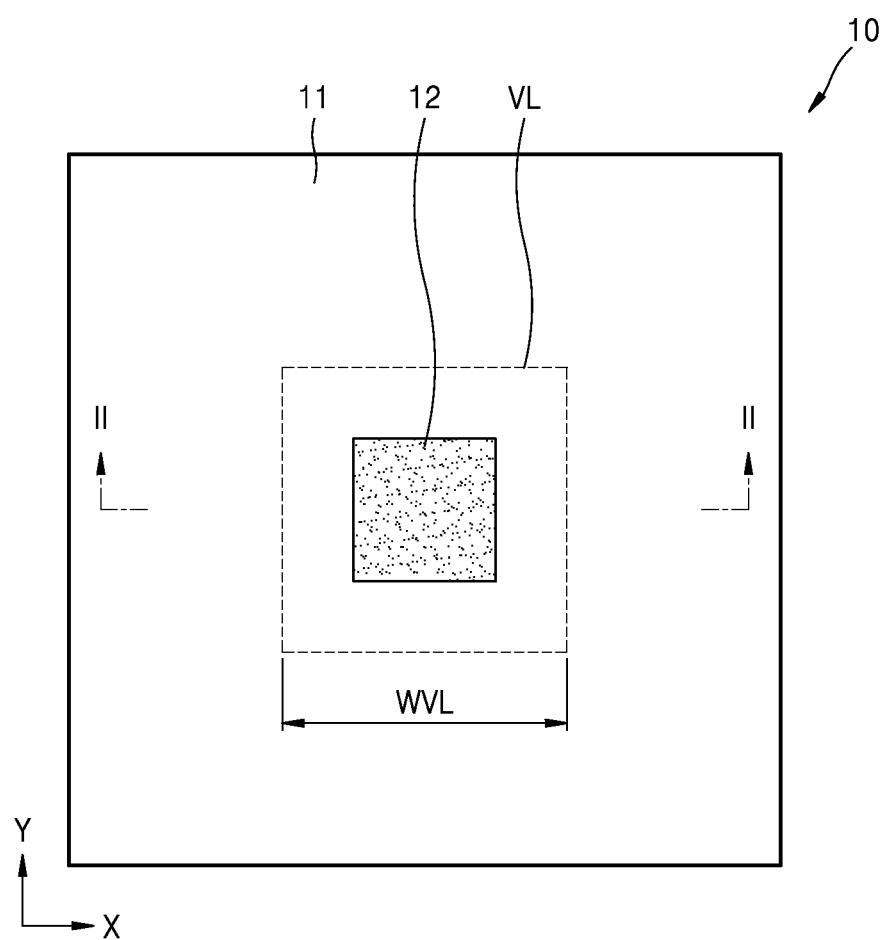
FIG. 1 is a schematic plan view illustrating an electric circuit according to an embodiment of the present disclosure.

Hereinafter, the configuration and operation of the present disclosure will be described in detail with reference to the embodiments of the present disclosure shown in the accompanying drawings.

While the present disclosure is susceptible to various modifications and alternative forms, specific embodiments thereof are shown by way of example in the drawings and will herein be described in detail. Advantages and features of the present disclosure and methods for accomplishing the same will be more clearly understood from embodiments described below with reference to the drawings. However, the present disclosure is not limited to the embodiments disclosed below but may be implemented in various forms.

Hereinafter, the embodiments of the present disclosure will be described below in detail with reference to the accompanying drawings, but when describing with reference to the drawings, equal or corresponding components will be referred to as the same reference numerals, and redundant descriptions thereof will be omitted.

In the following embodiments, the terms "first," "second," and the like have been used to distinguish one component from another, rather than limitative in all aspects.

In the following embodiments, singular forms are intended to include plural forms as well, unless the context clearly indicates otherwise.

In the following embodiments, the terms such as "including," "having," and "comprising" are intended to indicate the existence of features or components disclosed in the specification, and are not intended to preclude the possibility that one or more other features or components may be added.

For convenience of description, sizes of components shown in the drawings may be exaggerated or reduced. For example, since the size and thickness of each component illustrated in the drawing are arbitrarily shown for convenience of description, the present disclosure is not necessarily limited to those illustrated in the drawing.

In the following embodiments, an x-axis, a y-axis, and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process sequence may be performed differently from the described order. For example, two consecutively described processes may be performed substantially at the same time or performed in an order opposite to the described order.

Figure 2:
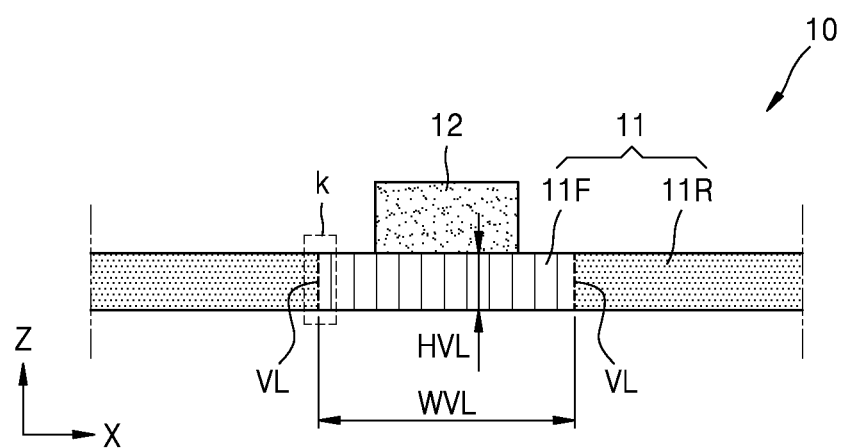
FIG. 2 is a cross-sectional view taken along line II-II of FIG. 1.
Figure 3:
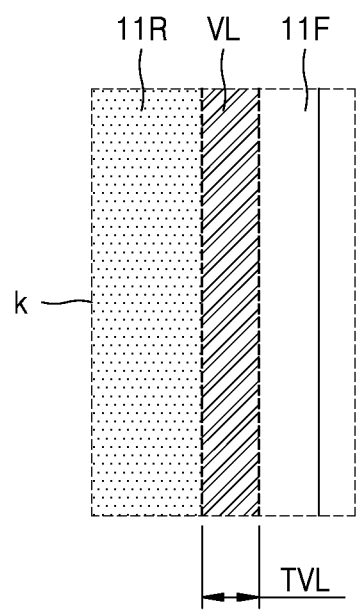
FIG. 3 is an enlarged view of portion K in FIG. 2.

FIG. 1 is a schematic plan view illustrating an electric circuit according to an embodiment of the present disclosure, FIG. 2 is a cross-sectional view taken along line II-II of FIG. 1, and FIG. 3 is an enlarged view of portion K in FIG. 2.

An electric circuit 10 of the present embodiment may include an active layer 11, an application electrode 12, and a variable low resistance region VL.

The active layer 11 may include a spontaneous polarization material. For example, the active layer 11 may include an insulating material and a ferroelectric material. That is, the active layer 11 may include a material having a spontaneous electric polarization (electric dipole) that may be reversed in the presence of an electric field.

In an alternative embodiment, the active layer 11 may include a perovskite-based material, for example, $BaTiO_3$, $SrTiO_3$, $BiFe_3$, $PbTiO_3$, $PbZrO_3$, or $SrBi_2Ta_2O_9$.

Further, in an embodiment, the active layer 11 may have an $ABX_3$ structure, where A may include one or more materials selected from an alkyl group of $C_nH_{2n+1}$ and inorganic materials such as Cs or Ru capable of forming a perovskite solar cell structure, B may include one or more materials selected from the group consisting of Pb, Sn, Ti, Nb, Zr, and Ce, and X may include a halogen material. In an embodiment, the active layer 11 may include $CH_3NH_3PbI_3$, $CH_3NH_3PbI_xCl_{3-x}$, $MAPbI_3$, $CH_3NH_3PbI_xBr_{3-x}$, $CH_3NH_3PbClxBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ (where $0<=x$ and $y<=1$).

Since other various ferroelectric materials may be used to form the active layer 11, descriptions of all examples thereof will be omitted. In addition, when the active layer 11 is formed, various other materials may be doped on the ferroelectric material to provide additional functions or improved electrical characteristics.

The active layer 11 has a spontaneous polarization, and by applying an electric field, the degree and direction of polarization may be controlled. In addition, the active layer 11 may maintain the polarization state even when the applied electric field is removed.

The application electrode 12 may be formed to apply an electric field to the active layer 11 and may apply, for example, a voltage to the active layer 11.

In an alternative embodiment, the application electrode 12 may be formed to be in contact with an upper surface of the active layer 11.

In addition, the application electrode 12 may be formed to apply voltages of various magnitudes to the active layer 11 and control a time during which the voltage is applied.

In an alternative embodiment, the application electrode 12 may be a gate electrode.

For example, the application electrode 12 may be electrically connected to a power source (not shown) or a power controller.

The application electrode 12 may include various materials and may include a material having a high electrical conductivity. For example, various metals may be used to form the application electrode 12.

For example, the application electrode 12 may include aluminum, chromium, titanium, tantalum, molybdenum, tungsten, neodymium, scandium, or copper. Alternatively, the application electrode 12 may also be formed using an alloy of these materials or may be formed using a nitride of these materials.

Further, in an alternative embodiment, the application electrode 12 may have a stacked structure.

Although not shown in the drawing, in an alternative embodiment, one or more insulating layers may be further disposed between the application electrode 12 and the active layer 11.

The variable low resistance region VL is a region formed in the active layer 11 and is a region through which current may flow, and may be formed as a current path having a linear shape in the periphery of the application electrode 12 as shown in FIG. 1.

Specifically, the variable low resistance region VL is a region having a lower electrical resistance than another region adjacent to the variable low resistance region VL in the region of the active layer 11.

In addition, even when the electric field through the application electrode 12 is removed after the variable low resistance region VL is formed through the application electrode 12, for example, the voltage is removed, the polarization state of the active layer 11 is maintained, and thus the variable low resistance region VL may be maintained and may maintain the state in which the current path is formed.

Through this, various electric circuits may be configured.

The variable low resistance region VL may have a height HVL, and the height HVL may correspond to a total thickness of the active layer 11.

The height HVL of the variable low resistance region VL may be proportional to the intensity of an electric field, e.g., the magnitude of a voltage, when the electric field is applied through the application electrode 12. The intensity of the electric field may be greater than at least an intrinsic coercive field of the active layer 11.

The variable low resistance region VL is a region formed when a voltage is applied to the active layer 11 through the application electrode 12, and may be changed, for example, generated, disappeared, and moved through the control of the application electrode 12.

The active layer 11 may include a first polarization region 11F having a first polarization direction, and the variable low resistance region VL may be formed at a boundary of the first polarization region 11F.

Further, the active layer 11 may include a second polarization region 11R, which has a second polarization direction, adjacent to the first polarization region 11F, and the variable low resistance region VL may be formed at a boundary of the second polarization region 11R. The second direction may be a direction different from at least the first direction, for example, may be a direction opposite to the first direction.

For example, the variable low resistance region VL may be formed between the first polarization region 11F and the second polarization region 11R.

The variable low resistance region VL may have a width WVL in one direction, which may be proportional to a moving distance of the variable low resistance region VL, which will be described below.

In an alternative embodiment, the thickness HVL1 may be in a range of 0.1 and 0.3 nanometers.

Figure 4A:
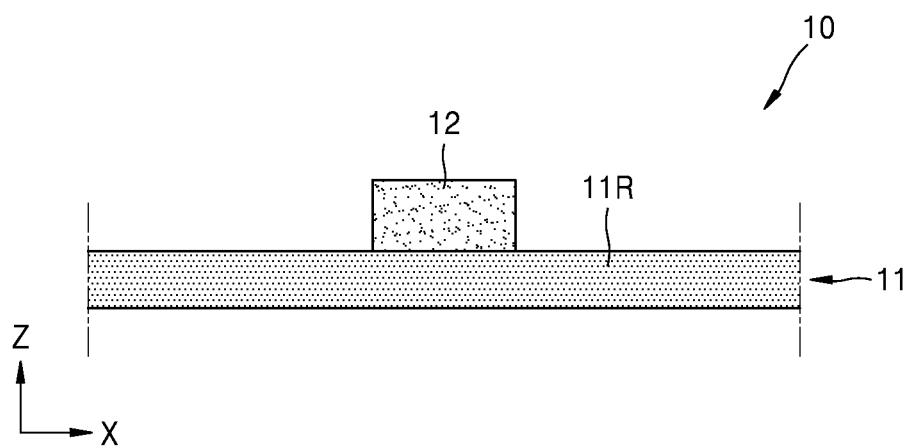
FIGS. 4A to 4C are views for describing a method of controlling a current path range for the electric circuit of FIG. 1.
Figure 4B:
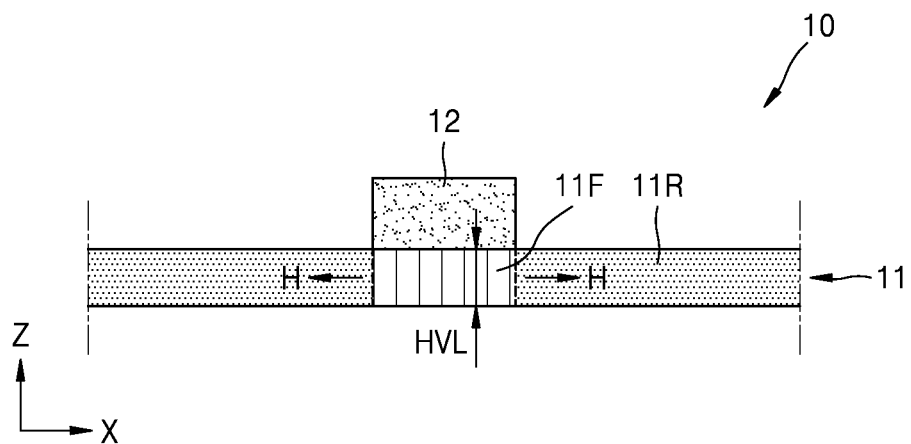
Figure 4C:
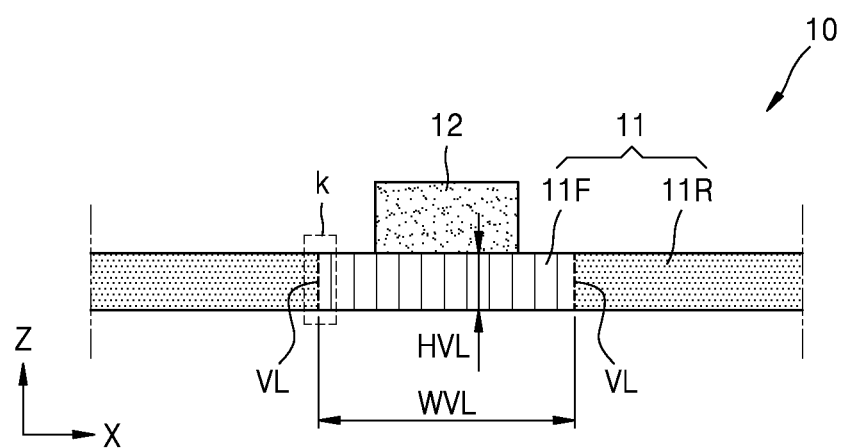

FIGS. 4A to 4C are views for describing a method of controlling a current path range for the electric circuit of FIG. 1.

Referring to FIG. 4A, the active layer 11 may include the second polarization region 11R having the second polarization direction. In an alternative embodiment, the polarization state of the active layer 11 as shown in FIG. 4A may be formed by applying an initialization electric field through the application electrode 12.

Then, referring to FIG. 4B, the first polarization region 11F is formed in the active layer 11. In an embodiment, the first polarization region 11F may be formed in a region overlapping the application electrode 12 so as to correspond to a width of the application electrode 12.

An electric field, which has an intensity greater than the coercive field of the active layer 11 or an intensity to the extent that the height HVL of the first polarization region 11F is formed to correspond to at least the total thickness of the active layer 11, may be applied to the active layer 11 through the application electrode 12.

By applying the electric field through the application electrode 12, the polarization direction of one region of the second polarization region 11R of the active layer 11 may be changed so that the one region of the second polarization region 11R is converted into the first polarization region 11F.

In an alternative embodiment, the growth rate of the first polarization region 11F in a direction of the height HVL significantly high, for example, the first polarization region 11F may grow in the direction of the height HVL at a rate of 1 km/sec.

Thereafter, when the electric field through the application electrode 12 is continuously maintained, that is, when a time has passed, the first polarization region 11F may increase in size as the first polarization region 11F moves in a horizontal direction H, that is, in a direction perpendicular to the height HVL. That is, a region of the second polarization region 11R may be gradually converted into the first polarization region 11F.

In an alternative embodiment, a growth rate of the first polarization region 11F in a horizontal direction H may be significantly high, for example, the first polarization region 11F may grow in the horizontal direction H at a rate of 1 m/sec.

Accordingly, a size of the variable low resistance region VL may be controlled, for example, the size may be a width of the variable low resistance region VL and may correspond to a growing distance of the first polarization region 11F, so that the size may be proportional to a growth rate of the variable low resistance region VL and an electric field maintenance time. For example, the growing distance may be proportional to a product of the growth rate and the electric field maintenance time.

In addition, the growth rate of the first polarization region 11F may be proportional to a sum of the growth rate in the direction of the height HVL and the growth rate in the horizontal direction H.

Accordingly, the size of the variable low resistance region VL may be controlled as desired by controlling the electric field maintenance time.

Specifically, as shown in FIG. 4C, the first polarization region 11F may increase in size by being spread widely, and accordingly, the variable low resistance region VL may move in a direction away from the application electrode 12.

In the present embodiment, a first polarization region having a first polarization direction different from a second polarization direction is formed in an active layer by applying an electric field to the active layer through an application electrode, and a variable low resistance region corresponding to a boundary between the first polarization region and a second polarization region may be formed. The variable low resistance region is a region having a low resistance, and is a region in which resistance is reduced and may become a current path, thereby easily forming an electric circuit.

In addition, in the present embodiment, the height of the variable low resistance region may be determined by controlling the intensity of the electric field, for example, the magnitude of a voltage, through the application electrode, and specifically, the variable low resistance region may be controlled to have a height corresponding to the total thickness of the active layer.

Further, the size, for example, the width, of the variable low resistance region may be determined by controlling the time during which the electric field through the application electrode is maintained. By controlling the size of the variable low resistance region, the size of the path through which the current flows may be easily controlled.

In addition, since the polarization state of the polarization region is maintained even when the electric field through the application electrode is removed, the current path may be easily maintained, and when the electric field through the application electrode is continuously maintained and the polarization region is expanded, the variable low resistance region, which has already been formed, is removed, so that the current may not flow therethrough.

Through this, it is possible to control the disappearance of a current path, and as a result, it is possible to easily control the flow of current.

The electric circuit of the present embodiment may be controlled to be used in various applications, and for example, one or more electrodes may be connected so as to be in contact with the variable low resistance region.

Figure 5:
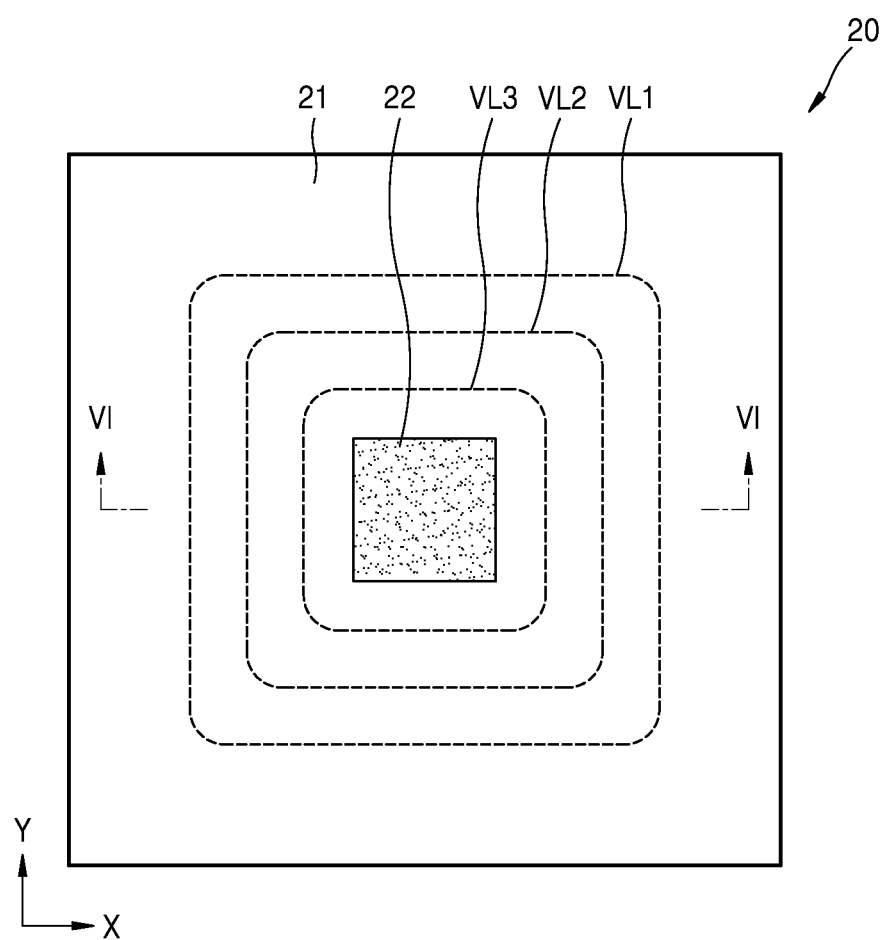
FIG. 5 is a schematic plan view illustrating an electric circuit according to an embodiment of the present disclosure.
Figure 6:
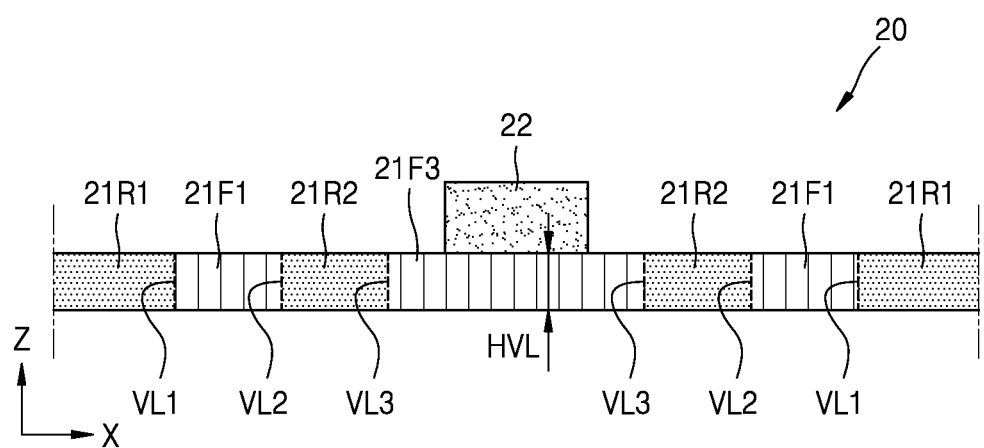
FIG. 6 is a cross-sectional view taken along line VI-VI of FIG. 5.

FIG. 5 is a schematic plan view illustrating an electric circuit according to an embodiment of the present disclosure, and FIG. 6 is a cross-sectional view taken along line VI-VI of FIG. 5.

Referring to FIGS. 5 and 6, an electric circuit 20 of the present embodiment may include an active layer 21, an application electrode 22, and variable low resistance regions VL1, VL2, and VL3.

The active layer 21 may include a spontaneous polarization material. For example, the active layer 21 may include an insulating material and a ferroelectric material. That is, the active layer 21 may include a material having a spontaneous electric polarization (electric dipole) that may be reversed in the presence of an electric field.

In an alternative embodiment, the active layer 21 may include a perovskite-based material, and a detailed description thereof is the same as that of the above-described embodiment and thus will be omitted.

The application electrode 22 may be formed to apply an electric field to the active layer 21, and may apply, for example, a voltage to the active layer 21. The detailed contents are the same as those of the above-described embodiment, and thus a description thereof will be omitted.

The variable low resistance regions VL1, VL2, and VL3 may include a first variable low resistance region VL1, a second variable low resistance region VL2, and a third variable low resistance region VL3.

The first variable low resistance region VL1 may have a width greater than that of the second variable low resistance region VL2, and the second variable low resistance region VL2 may have a width greater than that of the third variable low resistance region VL3.

In an alternative embodiment, the first variable low resistance region VL1 may be disposed on an outer periphery of the second variable low resistance region VL2, and the second variable low resistance region VL2 may be disposed on an outer periphery of the third variable low resistance region VL3.

The first variable low resistance region VL1, the second variable low resistance region VL2, and the third variable low resistance region VL3 are regions formed in the active layer 21 and are regions through which current may flow, and may be formed as current paths each having a linear shape.

Specifically, the first variable low resistance region VL1, the second variable low resistance region VL2, and the third variable low resistance region VL3 are regions of the active layer 21, having a lower electrical resistance than other regions adjacent to the first variable low resistance region VL1, the second variable low resistance region VL2, and the third variable low resistance region VL3 in the regions of the active layer 21.

In addition, even when the electric field through the application electrode 22 is removed after the first variable low resistance region VL1, the second variable low resistance region VL2, and the third variable low resistance region VL3 are formed through the application electrode 22, for example, the voltage is removed, the polarization state of the active layer 21 is maintained so that the first variable low resistance region VL1, the second variable low resistance region VL2, and the third variable low resistance region VL3 may be maintained and may maintain the state in which the current path is formed.

Through this, various electric circuits may be configured.

The variable low resistance regions VL1, VL2, and VL3 may each have a height HVL, and the height HVL may correspond to a total thickness of the active layer 21.

The active layer 21 may include first polarization regions 21F1, 21F2, and 21 F3 each having a first polarization direction, and the variable low resistance regions VL1, VL2, and VL3 may be formed at boundaries of the first polarization regions 21F1, 21F2, and 21F3, respectively.

In addition, the active layer 21 may include second polarization regions 21R1 and 21R2, each of which has a second polarization direction and adjacent to the respective first polarization regions 21F1, 21F2, and 21 F3, and the variable low resistance region VL may be formed at a boundary of each of the second polarization regions 21R1 and 21R2. The second direction may be a direction different from at least the first direction, for example, may be a direction opposite to the first direction.

For example, the first variable low resistance region VL1 may be formed between the first polarization region 21 F1 and the second polarization region 21R1.

Further, the second variable low resistance region VL2 may be formed between the first polarization region 21 F1 and the second polarization region 21R2.

Further, the third variable low resistance region VL3 may be formed between the first polarization region 21 F3 and the second polarization region 21R2.

FIGS. 7A to 7D are views for describing a method of controlling a current path range for the electric circuit of FIG. 5.

Figure 7A:
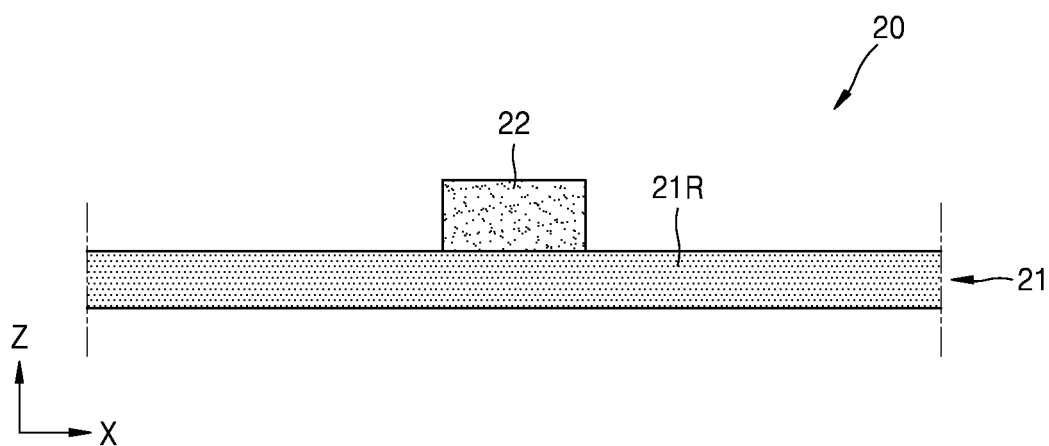
FIGS. 7A to 7D are views for describing a method of controlling a current path range for the electric circuit of FIG. 5.

Referring to FIG. 7A, the active layer 21 may include a second polarization region 21R having the second polarization direction. In an alternative embodiment, the polarization state of the active layer 21 as shown in FIG. 7A may be formed by applying an initialization electric field through the application electrode 22.

Figure 7B:
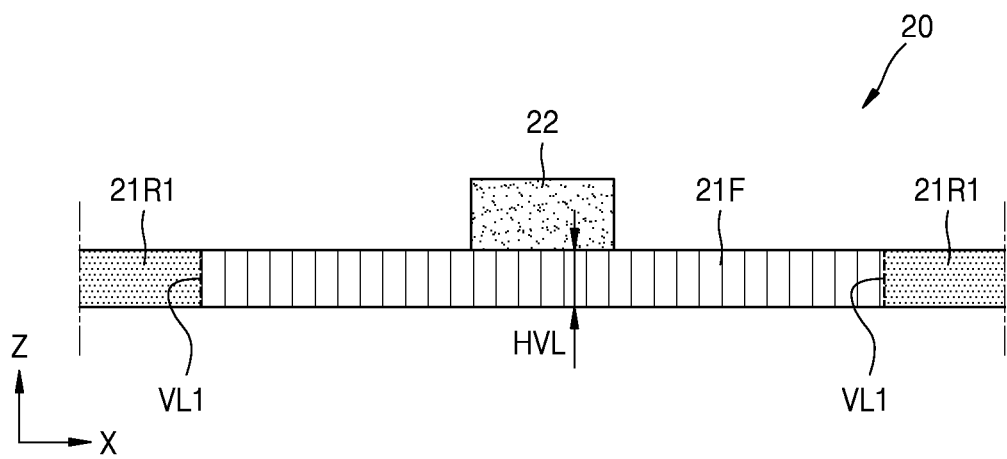

Then, referring to FIG. 7B, a first polarization region 21F is formed in the active layer 21. In an embodiment first, the first polarization region 21F may be formed in a region overlapping the application electrode 22 so as to correspond to a width of the application electrode 22, and then may be grown in a horizontal direction to have a state as shown in FIG. 7B. In addition, the first polarization region 21R of FIG. 7A may be reduced to be changed to the first polarization region 21R1 having the shape of FIG. 7B.

The first variable low resistance region VL1 may be formed between the first polarization region 21F and the second polarization region 21R1.

Figure 7C:
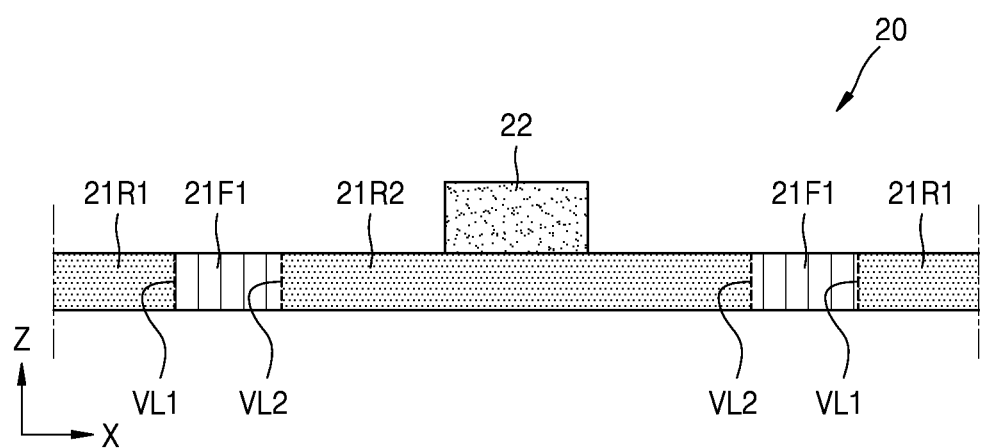

Thereafter, referring to FIG. 7C, the electric field having a direction opposite to that in FIG. 7B is applied so that the polarization direction of a partial region of the first polarization region 21F is changed to the second polarization direction of the second polarization region 21R2. For example, the second polarization region 21R2 having the second polarization direction that is the opposite direction to the first polarization direction of the first polarization region 21F may be formed.

In addition, through this, the first polarization region 21F shown in FIG. 7B may be reduced in size, and may be changed into the first polarization region 21F1 having a shape shown in FIG. 7C.

The second variable low resistance region VL2 may be formed between the second polarization region 21R2 and the first polarization region 21F1.

Since such a polarization state is maintained, the first variable low resistance region VL1 may be maintained as it is.

Figure 7D:
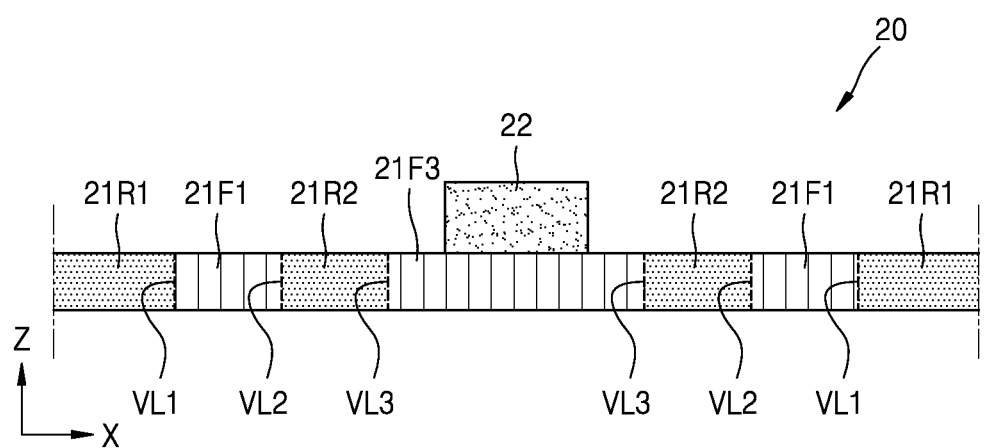

Thereafter, referring to FIG. 7D, the electric field having a direction opposite to that in FIG. 7C is applied so that the polarization direction of a partial region of the second polarization region 21R2 is changed to the first polarization direction of the first polarization region 21F3. For example, the first polarization region 21F3 having the first polarization direction that is the opposite direction to the second polarization direction of the second polarization region 21R2 may be formed.

In addition, through this, the second polarization region 21R2 shown in FIG. 7C may be reduced in size, and may be changed into the second polarization region 21R2 having a shape shown in FIG. 7D.

The third variable low resistance region VL3 may be formed between the second polarization region 21R2 and the first polarization region 21F3.

Since such a polarization state is maintained, the first variable low resistance region VL1 and the second variable low resistance region VL2 may be maintained as they are, and the third variable low resistance region VL3 may be added thereto.

In the present embodiment, a first polarization region having a first polarization direction different from a second polarization direction is formed in an active layer by applying an electric field to the active layer through an application electrode, and a variable low resistance region corresponding to a boundary between the first polarization region and a second polarization region may be formed. The variable low resistance region is a region having a low resistance, and is a region in which resistance is reduced and may become a current path, thereby easily forming an electric circuit.

In addition, in the present embodiment, an intensity of the electric field through the application electrode may be controlled, and a direction of the electric field may be controlled. Accordingly, it is possible to form a plurality of first polarization regions or a plurality of second polarization regions in the active layer.

A plurality of variable low resistance regions may be respectively formed at boundaries of the plurality of first polarization regions or the plurality of second polarization regions. Since each of the plurality of variable low resistance regions may form a current path, it is possible to easily generate and control electric circuits of various forms and applications.

Figure 8:
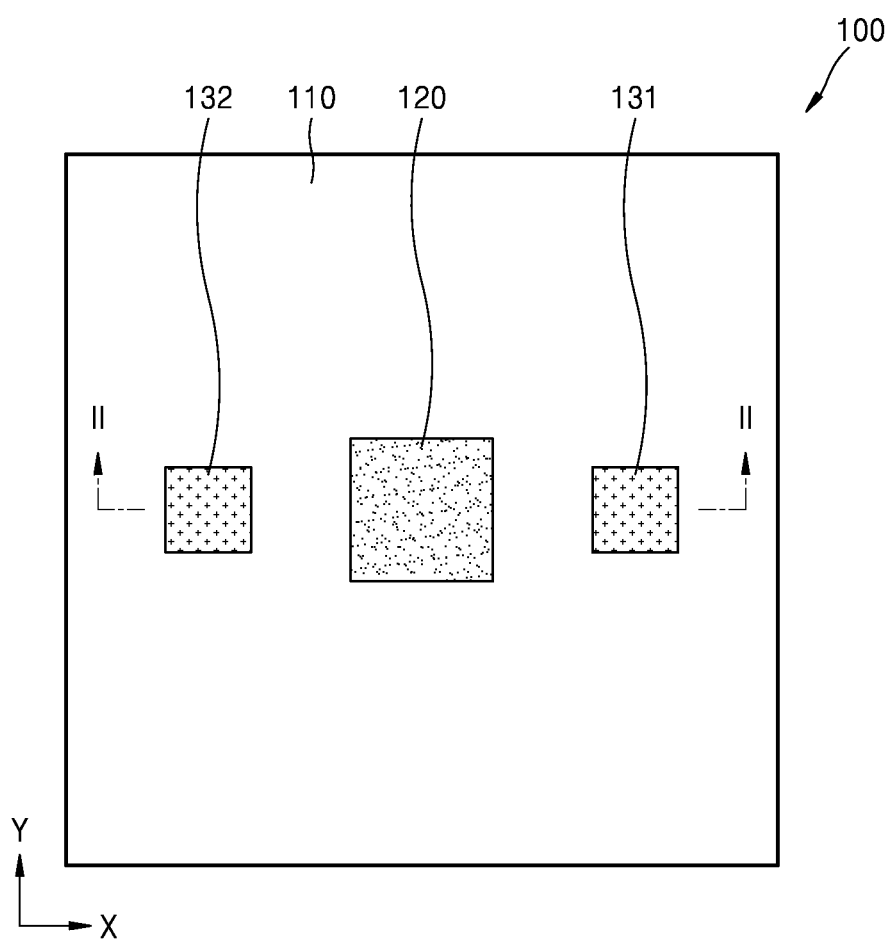
FIG. 8 is a schematic plan view illustrating an electric circuit according to an embodiment of the present disclosure.
Figure 9:
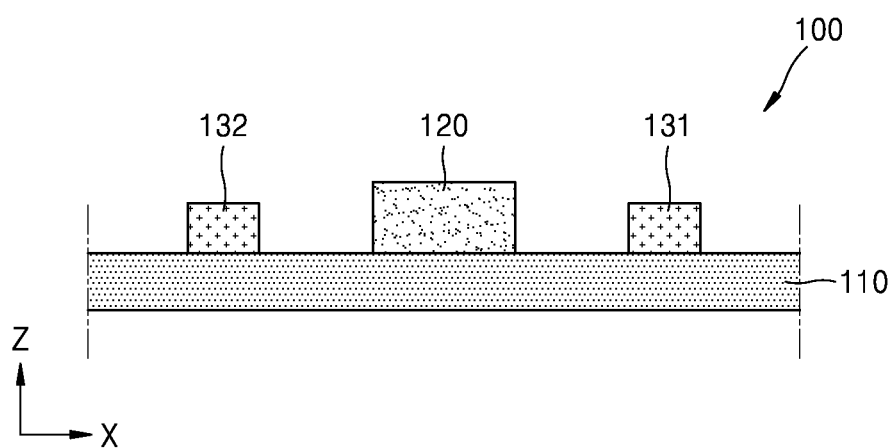
FIG. 9 is a cross-sectional view taken along line II-II of FIG. 8.

FIG. 8 is a schematic plan view illustrating an electric circuit according to an embodiment of the present disclosure, and FIG. 9 is a cross-sectional view taken along line II-II of FIG. 8.

Referring to FIGS. 8 and 9, an electric circuit 100 of the present embodiment may include an active layer 110, an application electrode 120, a variable low resistance region VL, and one or more connection electrode portions 131 and 132.

The active layer 110 may include a spontaneous polarization material. For example, the active layer 110 may include an insulating material and a ferroelectric material. That is, the active layer 110 may include a material having a spontaneous electric polarization (electric dipole) that may be reversed in the presence of an electric field.

In an alternative embodiment, the active layer 110 may include a perovskite-based material, for example, $BaTiO_3$, $SrTiO_3$, $BiFe_3$, $PbTiO_3$, $PbZrO_3$, or $SrBi_2Ta_2O_9$.

In an embodiment, the active layer 110 may have an $ABX_3$ structure, where A may include one or more materials selected from an alkyl group of $C_nH_{2n+1}$ and inorganic materials such as Cs or Ru capable of forming a perovskite solar cell structure, B may include one or more materials selected from the group consisting of Pb, Sn, Ti, Nb, Zr, and Ce, and X may include a halogen material. In an embodiment the active layer 110 may include $CH_3NH_3PbI_3$, $CH_3NH_3PbI_xCl_{3-x}$, $MAPbI_3$, $CH_3NH_3PbI_xBr_{3-x}$, $CH_3NH_3PbCl_x$, $HC(NH_2)_2PbI_3$, $HC(NH_2)_2PbI_xCl_{33-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ (where $0<=x$ and $y<=1$).

Since other various ferroelectric materials may be used to form the active layer 110, descriptions of all examples thereof will be omitted. In addition, when the active layer 110 is formed, various other materials may be doped on the ferroelectric material to provide additional functions or improved electrical characteristics.

The active layer 110 has a spontaneous polarization, and by applying an electric field, the degree and direction of polarization may be controlled. In addition, the active layer 110 may maintain the polarization state even when the applied electric field is removed.

The application electrode 120 may be formed to apply an electric field to the active layer 110 and may apply, for example, a voltage to the active layer 110.

In an alternative embodiment, the application electrode 120 may be formed to be in contact with an upper surface of the active layer 110.

In addition, the application electrode 120 may be formed to apply voltages of various magnitudes to the active layer 110 and control a time during which the voltage is applied.

In an alternative embodiment, the application electrode 120 may be a gate electrode.

For example, the application electrode 120 may be electrically connected to a power source (not shown) or a power controller.

The application electrode 120 may include various materials and may include a material having a high electrical conductivity. For example, various metals may be used to form the application electrode 120.

For example, the application electrode 120 may include aluminum, chromium, titanium, tantalum, molybdenum, tungsten, neodymium, scandium, or copper. Alternatively, the application electrode 120 may also be formed using an alloy of these materials or may be formed using a nitride of these materials.

Further, in an alternative embodiment, the application electrode 120 may have a stacked structure.

The connection electrode portions 131 and 132 may include one or more electrode members, for example, a first connection electrode member 131 and a second connection electrode member 132.

The connection electrode portions 131 and 132 may be formed on the active layer 110, for example, may be formed on the upper surface of the active layer 110 to be spaced apart from the application electrode 120, and in an alternative embodiment, the connection electrode portions 131 and 132 may be formed to be in contact with the active layer 110.

The first connection electrode member 131 and the second connection electrode member 132 may each be made of various conductive materials. For example, the first connection electrode member 131 and the second connection electrode member 132 may each include aluminum, chromium, copper, tantalum, titanium, molybdenum, or tungsten.

In an alternative embodiment, the first connection electrode member 131 and the second connection electrode member 132 may each include a structure in which a plurality of conductive layers are stacked.

In an alternative embodiment, the first connection electrode member 131 and the second connection electrode member 132 may each be made of a conductive metal oxide including, for example, indium oxide (e.g., $In_2O_3$), tin oxide (e.g., $SnO_2$), zinc oxide (e.g., ZnO), an indium oxide-tin oxide alloy (e.g., $In_2O_3.SnO_2$), or an indium oxide-zinc oxide alloy (e.g., $In_2O_3ZnO$).

In an alternative embodiment, the connection electrode portions 131 and 132 may be terminal members through which electrical signals are input and output.

Further, in an embodiment, the first connection electrode member 131 and the second connection electrode member 132 of the connection electrode portions 131 and 132 may each include a source electrode or a drain electrode.

FIGS. 10 to 14 are views for describing an operation of the electric circuit of FIG. 8.

Figure 10:
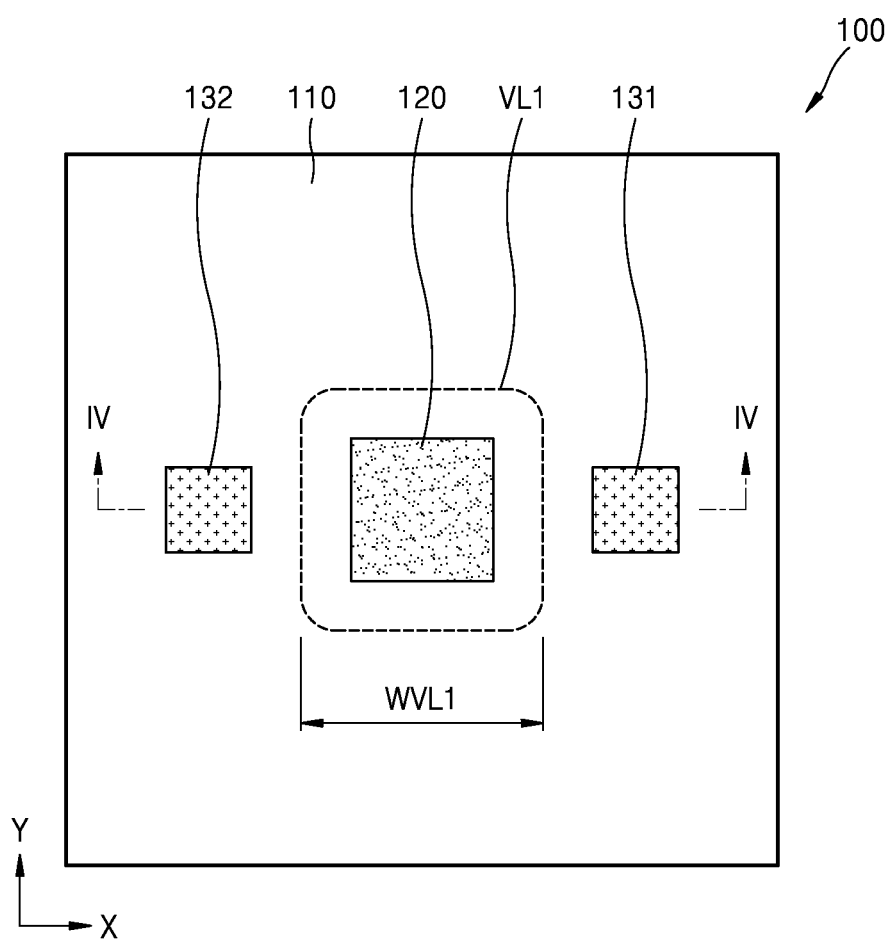
FIGS. 10 to 14 are views for describing an operation of the electric circuit of FIG. 8.
Figure 11:
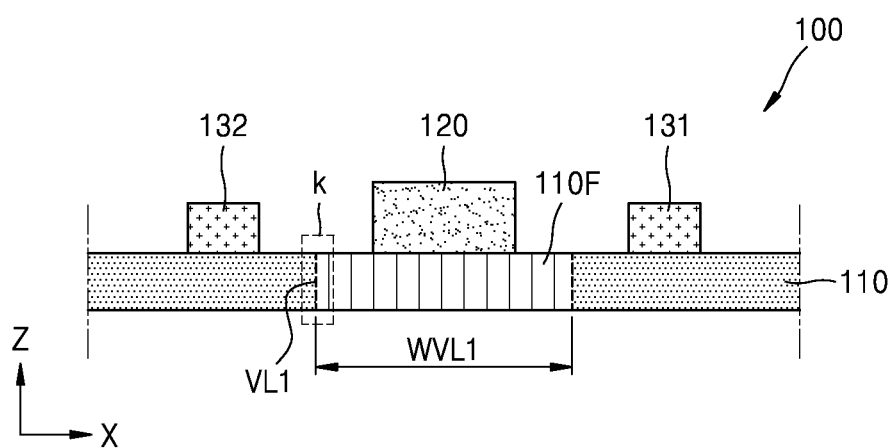
Figure 12:
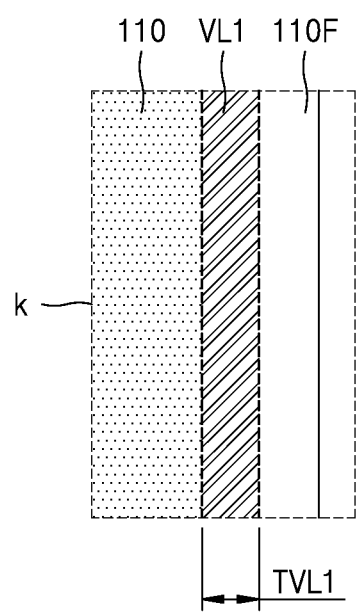

FIG. 10 is a view illustrating a state in which a first electric field is applied through the application electrode 120, FIG. 11 is a cross-sectional view taken along line IV-IV of FIG. 10, and FIG. 12 is an enlarged view of portion k of FIG. 11.

Referring to FIGS. 10 to 12, when the first electric field is applied to the active layer 110 through the application electrode 120, at least one region of the active layer 110 may include a polarization region 110F.

The polarization region 110F may have a shape surrounding the application electrode 120 with the application electrode 120 as a center thereof. The polarization region 110F may have a boundary line.

Figure 13:
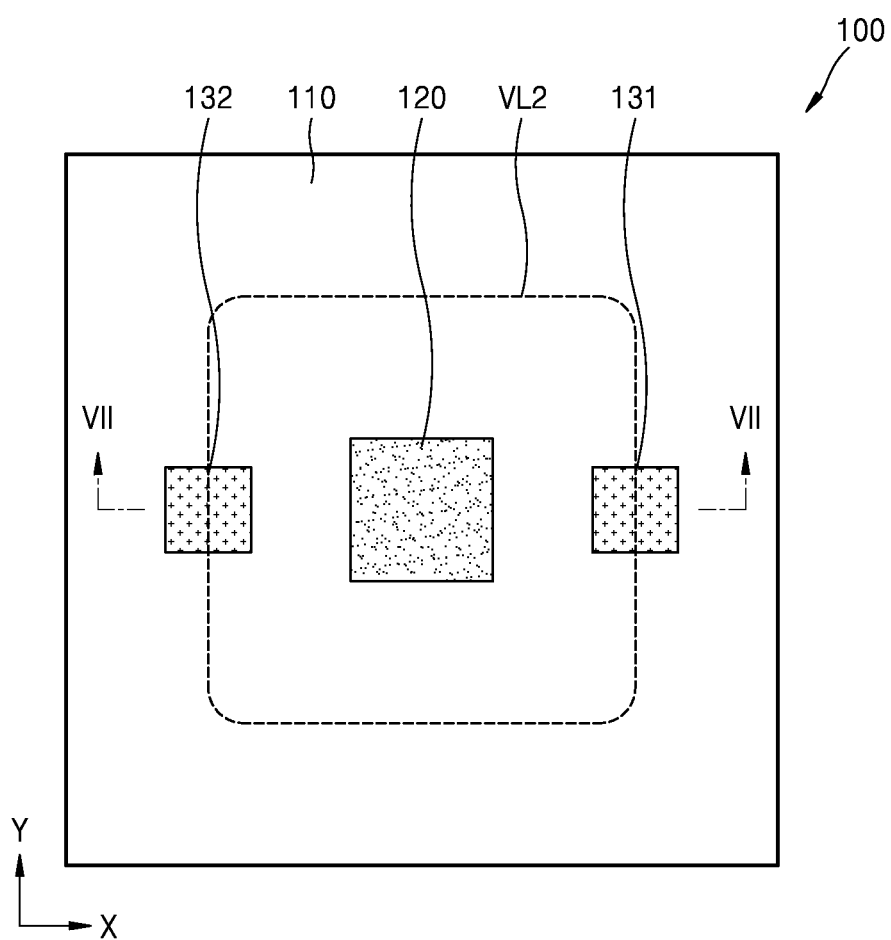

A first variable low resistance region VL1 may be formed in a region corresponding to a side surface of the boundary line. Referring to FIG. 13, the first variable low resistance region VL1 may be formed to have a linear shape surrounding the application electrode 120 with the application electrode 120 as a center thereof.

For example, the first variable low resistance region VL1 may have a first width WVL1 in one direction so as to surround the application electrode 120.

Further, the first variable low resistance region VL1 may be formed to correspond to the entire side surface of the boundary line of the polarization region 110F, and may have a thickness TVL1 in a direction away from a side surface of the polarization region 110F.

In an alternative embodiment, the thickness TVL1 may be in a range of 0.1 and 0.3 nanometers.

In an alternative embodiment, a process of applying an initialization electric field to the active layer 110 may be performed before a first voltage is applied to the active layer 110 through the application electrode 120.

Through the process of applying the initialization electric field to the active layer 110, a process of converting the entire region of the active layer 110 into a polarization region of a direction different from, for example, opposite to that of the polarization region 110F may be included.

Thereafter, the electric field having a direction opposite to the above-described direction may be applied to form the polarization region 110F in one region.

The first variable low resistance region VL1 formed at a boundary of the polarization region 110F of the active layer 110 may be changed into a region having a lower resistance than other regions of the active layer 110. For example, the first variable low resistance region VL1 may have a lower resistance than the polarization region 110F of the active layer 110 and a region of the active layer 110 in the periphery of the first variable low resistance region VL1.

Thus, the first variable low resistance region VL1 may form a current path. In an alternative embodiment, the first variable low resistance region VL1 may correspond to one region of a plurality of domain walls included in the active layer 110.

Further, the first variable low resistance region VL1 may be continuously maintained while the polarization state of the polarization region 110F of the active layer 110 is maintained. That is, even when the first voltage, which is applied to the active layer 110F through the application electrode 120, is removed, the state of the variable low resistance region VL1, that is, the low resistance state, may be maintained.

As shown in FIGS. 10 and 11, a current path may be formed through the first variable low resistance region VL1. However, since the connection electrode portions 131 and 132 do not correspond to the first variable low resistance region VL1, the flow of current through the connection electrode portions 131 and 132 may not occur.

Figure 14:
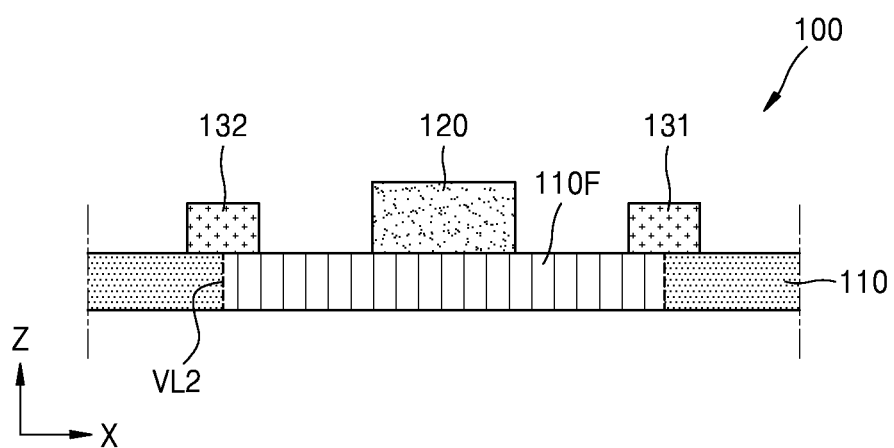

FIG. 13 is a view illustrating a state in which the first electric field through the application electrode 120 is further maintained for a predetermined time, and FIG. 14 is a cross-sectional view taken along line VII-VII of FIG. 13.

Referring to FIGS. 13 and 14, as the time during which the first electric field through the application electrode 120 is maintained becomes longer, the polarization region 110F of FIGS. 11 and 12 moves in a horizontal direction, so that the polarization region 110F becomes greater in size. Accordingly, a second variable low resistance region VL2 that is greater in size than the first variable low resistance region VL1 may be formed.

For example, the voltage applied in FIGS. 11 and 12 may be maintained for a predetermined time to form the structure shown in FIGS. 13 and 14.

The polarization region 110F may have a shape surrounding the application electrode 120 with the application electrode 120 as a center thereof. The polarization region 110F may have a boundary line. The second variable low resistance region VL2 may be formed in a region corresponding to a side surface of the boundary line of the polarization region 110F. Referring to FIG. 13, the second variable low resistance region VL2 may be formed to have a linear shape surrounding the application electrode 120 with the application electrode 120 as a center thereof.

For example, the second variable low resistance region VL2 may have a second width WVL2 in one direction so as to surround the application electrode 120, and the second width WVL2 may be greater than the first width WVL1.

In addition, the second variable low resistance region VL2 may be formed to correspond to the entire side surface of the boundary line of the polarization region 110F, and may have a thickness in a direction away from a side surface of the polarization region 110F, and in an alternative embodiment, the thickness may be in a range of 0.1 to 0.3 nanometers.

The second variable low resistance region VL2 formed at the boundary of the polarization region 110F of the active layer 110 may be changed into a region having a lower resistance than other regions of the active layer 110. For example, the second variable low resistance region VL2 may have a lower resistance than the polarization region 110F of the active layer 110 and a region of the active layer 110 in the periphery of the second variable low resistance region VL2.

Thus, the second variable low resistance region VL2 may form a current path.

In an alternative embodiment, the second variable low resistance region VL2 may correspond to one region of the plurality of domain walls included in the active layer 110.

Further, the second variable low resistance region VL2 may be continuously maintained while the polarization state of the active layer 110F is maintained. That is, even when a second voltage applied to the active layer 110F through the application electrode 120 is removed, the state of the second variable low resistance region VL2, that is, the low resistance state, may be maintained.

Thus, a current path may be formed through the second variable low resistance region VL2.

Further, in an embodiment, the connection electrode portions 131 and 132 are formed to correspond to the second variable low resistance region VL2, for example, the first connection electrode member 131 and the second connection electrode member 132 of the connection electrode portions 131 and 132 may be disposed to be in contact with an upper surface of the second variable low resistance region VL2 while being spaced apart from each other.

Accordingly, current may flow through the first connection electrode member 131 and the second connection electrode member 132 of the connection electrode portions 131 and 132.

Further, various electrical signals may be generated. For example, when the electric field in the state of FIGS. 13 and 14 is continuously applied further, that is, when the application time is increased, the second variable low resistance region VL2 may further move to deviate from the first connection electrode member 131 and the second connection electrode member 132. Accordingly, current may not flow through the first connection electrode member 131 and the second connection electrode member 132.

Further, in an alternative embodiment, an initialization process may be performed on the entire active layer 110.

Thereafter, when the electric field is applied again to the active layer 110 through the application electrode 120, current may flow through the first connection electrode member 131 and the second connection electrode member 132 of the connection electrode portions 131 and 132.

In an electric circuit of the present embodiment, voltages of various magnitudes may be applied to an active layer through an application electrode, and an application time may be controlled.

Accordingly, a polarization region having a desired size may be formed in the active layer, and a variable low resistance region may be formed at a boundary of the polarization region.

When connection electrode portions are formed to correspond to the variable low resistance region, for example, to be in contact with the variable low resistance region, current may flow through the connection electrode portions. The active layer including a ferroelectric material may maintain a polarization state even when the voltage is removed, and accordingly, the variable low resistance region at the boundary of the polarization region may be maintained, and thus the current may continuously flow.

In addition, the voltage may be applied to the active layer through the application electrode such that the variable low resistance region is converted into the polarization region, as a result, current does not flow through the connection electrode portions through which the current has flowed.

The flow of current may be controlled by controlling the voltage of the application electrode, and the electric circuit may be used for various applications by controlling the flow of current.

In an alternative embodiment, the electric circuit may be used as a memory.

For example, the electric circuit may be used as a memory by defining a state in which current flows as 1 and a state in which the current does not flow as 0. In an embodiment, the electric circuit may be used as a non-volatile memory in which current may flow even when voltage is removed.

Further, the electric circuit may be configured as a circuit unit generating and transmitting various signals and may also be used as a switching element.

Further, the electric circuit may be applied in a simple structure to other parts requiring the control of electrical signals, and thus may be applied to various fields such as variable circuits, central processing units (CPUs), biochips, and the like.

Figure 15:
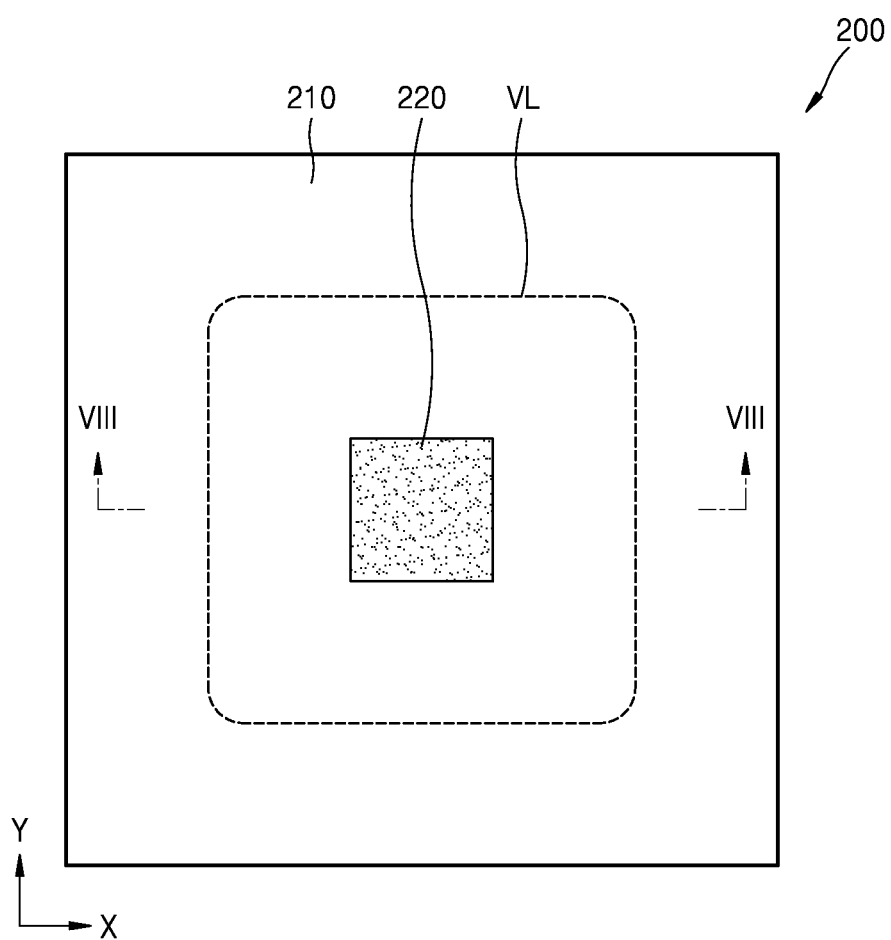
FIG. 15 is a schematic plan view illustrating an electric circuit according to an embodiment of the present disclosure.
Figure 16:
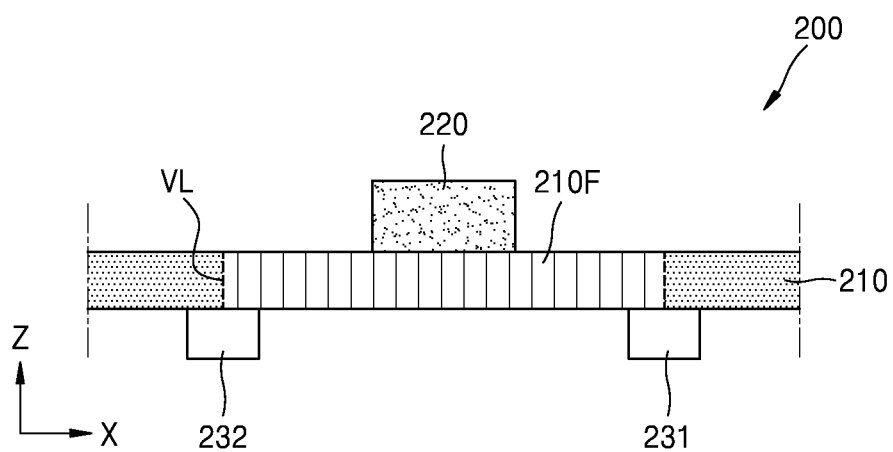
FIG. 16 is a cross-sectional view taken along line VIII-VIII of FIG. 15.

FIG. 15 is a schematic plan view illustrating an electric circuit according to an embodiment of the present disclosure, and FIG. 16 is a cross-sectional view taken along line VIII-VIII of FIG. 15.

Referring to FIGS. 15 and 16, an electric circuit 200 of the present embodiment may include an active layer 210, an application electrode 220, a variable low resistance region VL, and connection electrode portions 231 and 232.

For convenience of description, differences from the above-described embodiments will be mainly described.

The active layer 210 may include a spontaneous polarization material. For example, the active layer 210 may include an insulating material and a ferroelectric material. That is, the active layer 210 may include a material having a spontaneous electric polarization (electric dipole) that may be reversed in the presence of an electric field.

A description of a material for forming the active layer 210 is the same as or modified from that of the above-described embodiment, and thus, a detailed description thereof will be omitted.

The application electrode 220 may be formed to apply an electric field to the active layer 210, and may apply, for example, a voltage to the active layer 210.

In an alternative embodiment, the application electrode 220 may be formed to be in contact with an upper surface of the active layer 210.

A description of a material for forming the application electrode 220 is the same as or modified from that of the above-described embodiment, and thus, a detailed description thereof will be omitted.

The connection electrode portions 231 and 232 may include at least one electrode member, for example, a first connection electrode member 231 and a second connection electrode member 232.

The connection electrode portions 231 and 232 may be formed on the active layer 210, for example, on a surface of the active layer 210 opposite to the surface, on which the application electrode 220 is formed, to be spaced apart from the application electrode 220.

The application electrode 220 may be formed on the upper surface of the active layer 210, and the connection electrode portions 231 and 232 may be formed on a lower surface of the active layer 210.

In an alternative embodiment, the connection electrode portions 231 and 232 may be formed to be in contact with the active layer 210.

The first connection electrode member 231 and the second connection electrode member 232 may each be made of various conductive materials.

A description of a material for forming the first and second connection electrode members 231 and 232 is the same as or modified from that of the above-described embodiment, and thus, a detailed description thereof will be omitted.

Referring to FIG. 16, when a voltage is applied to the active layer 210 through the application electrode 220, at least one region of the active layer 210 may include a polarization region 210F.

The variable low resistance region VL may be formed in a region corresponding to a side surface of a boundary line of the polarization region 210F, and referring to FIG. 15, the variable low resistance region VL may be formed in a linear shape surrounding the application electrode 220 with the application electrode 220 as a center thereof.

For example, the variable low resistance region VL may have a width in one direction so as to surround the application electrode 220.

In addition, the variable low resistance region VL may be formed to correspond to the entire side surface of the boundary line of the polarization region 210F, and may have a thickness in a direction away from a side surface of the polarization region 210F, and in an alternative embodiment, the thickness may be in a range of 0.1 to 0.3 nanometers.

The variable low resistance region VL formed at a boundary of the polarization region 210F of the active layer 210 may be changed into a region having a lower resistance than other regions of the active layer 210. For example, the variable low resistance region VL may have a lower resistance than the polarization region 210F of the active layer 210 and a region of the active layer 210 in the periphery of the variable low resistance region VL.

Thus, the variable low resistance region VL may form a current path.

In an alternative embodiment, the variable low resistance region VL may correspond to one region of a plurality of domain walls included in the active layer 210.

Further, the variable low resistance region VL may be continuously maintained while the polarization state of the active layer 210F is maintained. That is, even when the voltage applied to the active layer 210F through the application electrode 220 is removed, the state of the variable low resistance region VL, that is, the low resistance state, may be maintained.

A current path may be formed through the variable low resistance region VL.

Further, In an embodiment the connection electrode portions 231 and 232 are formed to correspond to the variable low resistance region VL, for example, the first connection electrode member 231 and the second connection electrode member 232 of the connection electrode portions 231 and 232 may be disposed to be in contact with a lower surface of the variable low resistance region VL while being spaced apart from each other.

Accordingly, current may flow through the first connection electrode member 231 and the second connection electrode member 232 of the connection electrode portions 231 and 232.

In an electric circuit of the present embodiment, voltages of various magnitudes may be applied to an active layer through an application electrode, and an application time may be controlled.

Accordingly, a polarization region having a desired size may be formed in the active layer, and a variable low resistance region may be formed at a boundary of the polarization region.

Further, the application electrode is formed on one surface of the active layer, and connection electrode portions are formed on the other surface of the active layer, so that it is possible to easily perform precise patterning and miniaturization on the electric circuit.

Figure 17:
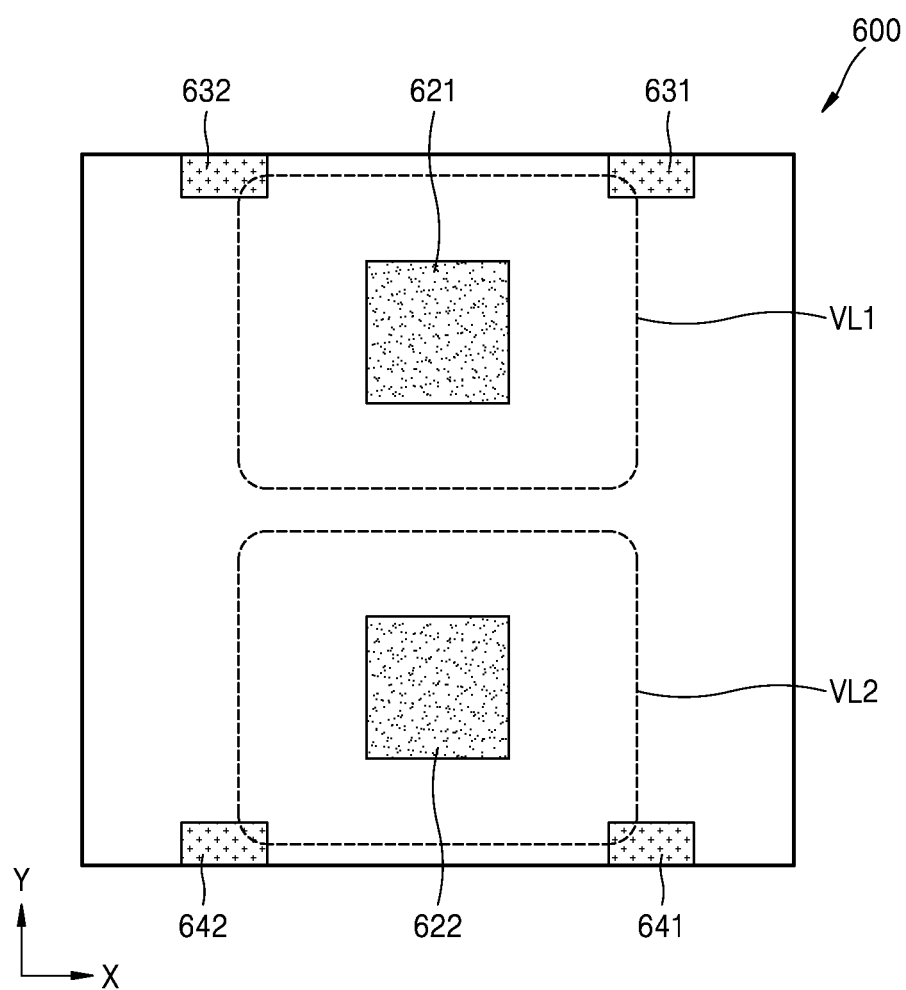
FIG. 17 is a schematic plan view illustrating an electric circuit according to an embodiment.

FIG. 17 is a schematic plan view illustrating an electric circuit according to an embodiment.

Referring to FIG. 17, an electric circuit 600 of the present embodiment may include an active layer, first and second application electrodes 621 and 622, first and second variable low resistance regions VL1 and VL2, and connection electrode portions 631, 632, 641, and 642.

The active layer may include a spontaneous polarization material. For example, the active layer may include an insulating material and a ferroelectric material. That is, the active layer may include a material having a spontaneous electric polarization (electric dipole) that may be reversed in the presence of an electric field.

A description of a material for forming the active layer is the same as or modified from that of the above-described embodiment, and thus, a detailed description thereof will be omitted.

Each of the first and second application electrodes 621 and 622 may be formed to apply an electric field to the active layer, and may apply, for example, a voltage to the active layer.

In an alternative embodiment, the first and second application electrodes 621 and 622 may each be formed to be in contact with an upper surface of the active layer, and the first application electrode 621 and the second application electrode 622 may be disposed to be spaced apart from each other.

A description of a material for forming the first and second application electrodes 621 and 622 is the same as or modified from the application electrode of the above-described embodiment, and thus, a detailed description thereof will be omitted.

The connection electrode portions 631, 632, 641, and 642 may include at least one electrode member, for example, a first connection electrode member 631, a second connection electrode member 632, a third connection electrode member 641, and a fourth connection electrode member 642.

The connection electrode portions 631, 632, 641, and 642 may be formed on the active layer, for example, may be formed on the upper surface of the active layer to be spaced apart from the application electrode 620. In an alternative embodiment, the connection electrode portions 631, 632, 641, and 642 may be formed to be in contact with the active layer.

The first connection electrode member 631, the second connection electrode member 632, the third connection electrode member 641, and the fourth connection electrode member 642 may each be made of various conductive materials.

Descriptions of the first connection electrode member 631, the second connection electrode member 632, the third connection electrode member 641, and the fourth connection electrode member 642 may be the same as or modified from the connection electrode portion of the above-described embodiment, and thus, detailed descriptions thereof will be omitted.

FIG. 17 a view illustrating a state in which a first electric field is applied through the first and second application electrodes 621 and 622.

Referring to FIG. 17, when a first voltage is applied to the active layer through the first application electrode 621, at least one region of the active layer may include a polarization region (e.g., an inner side region of "VL1").

The polarization region of the active layer may have a shape surrounding the application electrodes 620 with the first application electrode 621 as a center thereof. That is, the inner side region of the first variable low resistance region VL1 may correspond to the polarization region of the active layer.

The first variable low resistance region VL1 may be formed in a region corresponding to a side surface of a boundary line. Referring to FIG. 17, the first variable low resistance region VL1 may be formed to have a linear shape surrounding the application electrode 621 with the application electrode 621 as a center thereof.

Further, the first variable low resistance region VL1 may be formed to correspond to the entire side surface of the boundary line of the polarization region of the active layer, and may have a thickness in a direction away from a side surface of the polarization region.

In an alternative embodiment, the thickness may be in a range of 0.1 to about 0.3 nanometers.

Referring to FIG. 17, when the first electric field is applied to the active layer through the second application electrode

622, at least one region of the active layer may include a polarization region (e.g., an inner side region of "VL2").

The polarization region of the active layer may have a shape surrounding the application electrode 620 with the second application electrode 622 as a center thereof. That is, the inner side region of the second variable low resistance region VL2 may correspond to the polarization region of the active layer.

The second variable low resistance region VL2 may be formed in a region corresponding to a side surface of a boundary line. Referring to FIG. 17, the second variable low resistance region VL2 may be formed to have a linear shape surrounding the application electrode 620 with the application electrode 620 as a center thereof.

Further, the second variable low resistance region VL2 may be formed to correspond to the entire side surface of the boundary line of the polarization region of the active layer, and may have a thickness in a direction away from a side surface of the polarization region.

In an alternative embodiment, the thickness may be in a range of 0.1 to about 0.3 nanometers.

The second variable low resistance region VL2 may be formed to be spaced apart from the first variable low resistance region VL1.

For example, each of the first variable low resistance region VL1 and the second variable low resistance region VL2 may have a polygonal shape or a closed-curve-like shape.

Each of the first and second variable low resistance regions VL1 and VL2 may form a current path.

A current path may be formed through the first variable low resistance region VL1, and in this case, the connection electrode portions 631 and 632 may correspond to the first variable low resistance region VL1, and the flow of current may occur in the connection electrode portions 631 and 632.

In addition, a current path may be formed through the second variable low resistance region VL2, and in this case, the connection electrode portions 641 and 642 may correspond to the second variable low resistance region VL2, and the flow of current may occur in the connection electrode portions 641 and 642.

That is, since the application of voltage through the first and second application electrodes 621 and 622 is controlled, it is possible to simultaneously form different current paths for the respective regions.

In an alternative embodiment, positions in which the first connection electrode member 641 and the second connection electrode member 642 are formed are disposed to respectively face positions in which the third connection electrode member 643 and the fourth connection electrode member 644 are formed, so that positions of the current paths may be controlled to be distinguished from each other.

In an electric circuit of the present embodiment, voltages of various magnitudes may be applied to an active layer through application electrodes, and an application time may be controlled.

Accordingly, polarization regions each having a desired size may be formed in the active layer, and a first variable low resistance region and a second variable low resistance region may each be formed at boundaries of the polarization regions.

When connection electrode portions are formed to correspond to the first variable low resistance region and the second variable low resistance region, for example, to be in contact with the first variable low resistance region and the second variable low resistance region, current may flow through the connection electrode portions. The active layer including a ferroelectric material may maintain the polarization state even when the voltage is removed, and accordingly, the variable low resistance regions at the boundaries of the polarization regions may be maintained, and thus the current may continuously flow.

Further, the voltage may be applied to the active layer through the application electrodes such that the variable low resistance region is converted into the polarization region, as a result, current does not flow through the connection electrode portions through which the current has flowed.

The flow of current may be controlled by controlling the voltage of the application electrode, and the electric circuit may be used for various applications by controlling the flow of current.

In addition, since two current paths of the first variable low resistance region and the second variable low resistance region may be formed, the generation and use of various signals may be facilitated.

Figure 18:
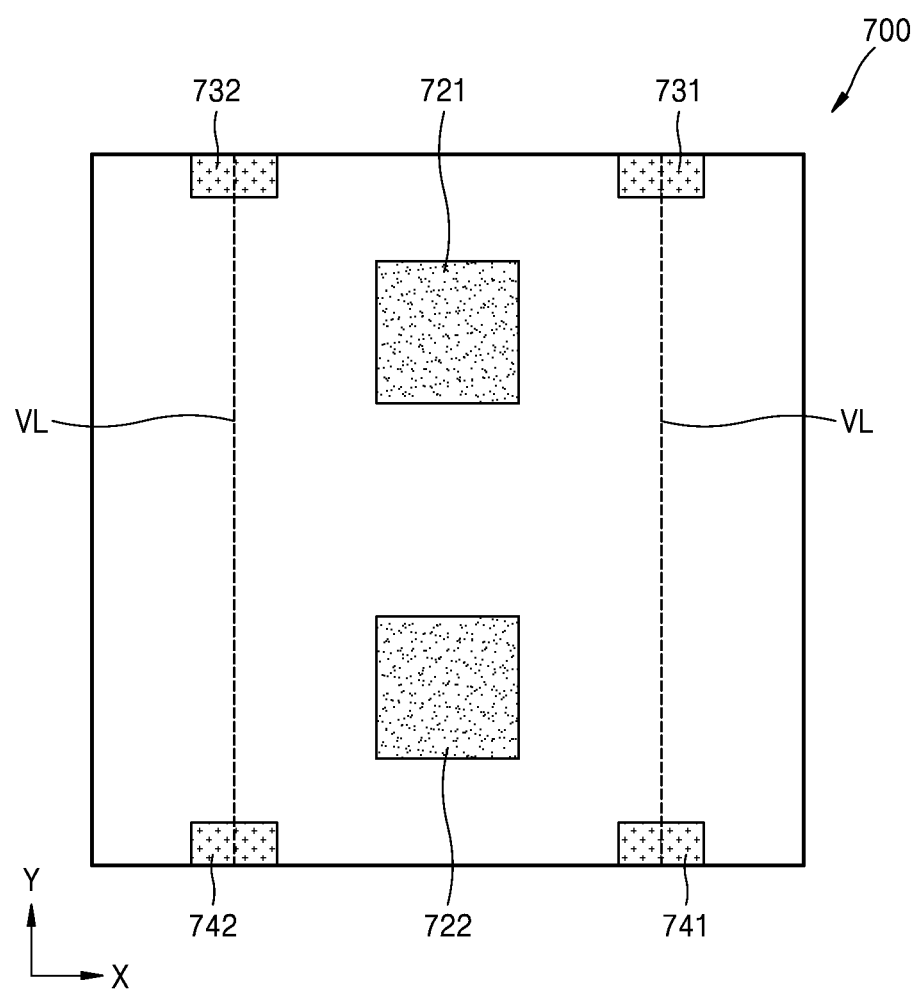
FIG. 18 is a schematic plan view illustrating an electric circuit according to an embodiment.

FIG. 18 is a schematic plan view illustrating an electric circuit according to an embodiment.

Referring to FIG. 18, an electric circuit 700 of the present embodiment may include an active layer, first and second application electrodes 721 and 722, a variable low resistance region VL, and connection electrode portions 731, 732, 741, and 742.

The active layer may include a spontaneous polarization material. For example, the active layer may include an insulating material and a ferroelectric material. That is, the active layer may include a material having a spontaneous electric polarization (electric dipole) that may be reversed in the presence of an electric field.

A description of a material for forming the active layer is the same as or modified from that of the above-described embodiment, and thus, a detailed description thereof will be omitted.

Each of the first and second application electrodes 721 and 722 may be formed to apply an electric field to the active layer, and may apply, for example, a voltage to the active layer.

In an alternative embodiment, the first and second application electrodes 721 and 722 may each be formed to be in contact with an upper surface of the active layer, and the first application electrode 721 and the second application electrode 722 may be disposed to be spaced apart from each other.

A description of a material for forming the first and second application electrodes 721 and 722 is the same as or modified from the application electrode of the above-described embodiment, and thus, a detailed description thereof will be omitted.

The connection electrode portions 731, 732, 741, and 742 may include at least one electrode member, for example, a first connection electrode member 731, a second connection electrode member 732, a third connection electrode member 741, and a fourth connection electrode member 742.

The connection electrode portions 731, 732, 741, and 742 may be formed on the active layer, for example, may be formed on the upper surface of the active layer to be spaced apart from the application electrodes 721, 722. In an alternative embodiment, the connection electrode portions 731, 732, 741, and 742 may be formed to be in contact with the active layer.

The first connection electrode member 731, the second connection electrode member 732, the third connection electrode member 741, and the fourth connection electrode member 742 may each be made of various conductive materials.

Descriptions of the first connection electrode member 731, the second connection electrode member 732, the third connection electrode member 741, and the fourth connection electrode member 742 may be the same as or modified from the connection electrode portion of the above-described embodiment, and thus, detailed descriptions thereof will be omitted.

FIG. 18 a view illustrating a state in which a second electric field is applied through the first and second application electrodes 721 and 722.

In an alternative embodiment, FIG. 18 may have the same structure as FIG. 17 and may have a state in which the first electric field through the first and second application electrodes 721 and 722 is maintained longer than that of FIG. 17. In an embodiment, it can be seen that two polarization regions formed in FIG. 17 overlap each other and are integrated into one polarization region and accordingly the variable low resistance region VL is formed by being modified.

Accordingly, variable low resistance regions also overlap each other to form one variable low resistance region VL.

The variable low resistance region VL may be elongated and correspond to one side surface of the active layer and the other side surface of the active layer opposite to the one side surface.

The variable low resistance region VL may form a current path.

The connection electrode portions 731 and 741 correspond to one line of the variable low resistance region VL, and the flow of current may occur in the connection electrode portions 731 and 741.

Further, the connection electrode portions 732 and 742 correspond to one line of the variable low resistance region VL, and the flow of current may occur in the connection electrode portions 732 and 742.

Accordingly, the flow of current may occur in each of opposite sides of a region of the active layer with the first application electrode 721 and the second application electrode 722 between the opposite sides.

In an electric circuit of the present embodiment, voltages of various magnitudes may be applied to an active layer through a plurality of application electrodes, and an application time may be controlled.

Accordingly, polarization regions each having a desired size may be formed in the active layer, and the polarization regions may be controlled to overlap each other.

A variable low resistance region may be formed at a boundary of the overlapping polarization region to correspond to a side surface of the active layer.

With such a variable low resistance region, current flow may be formed in various regions of the active layer.

Figure 19:
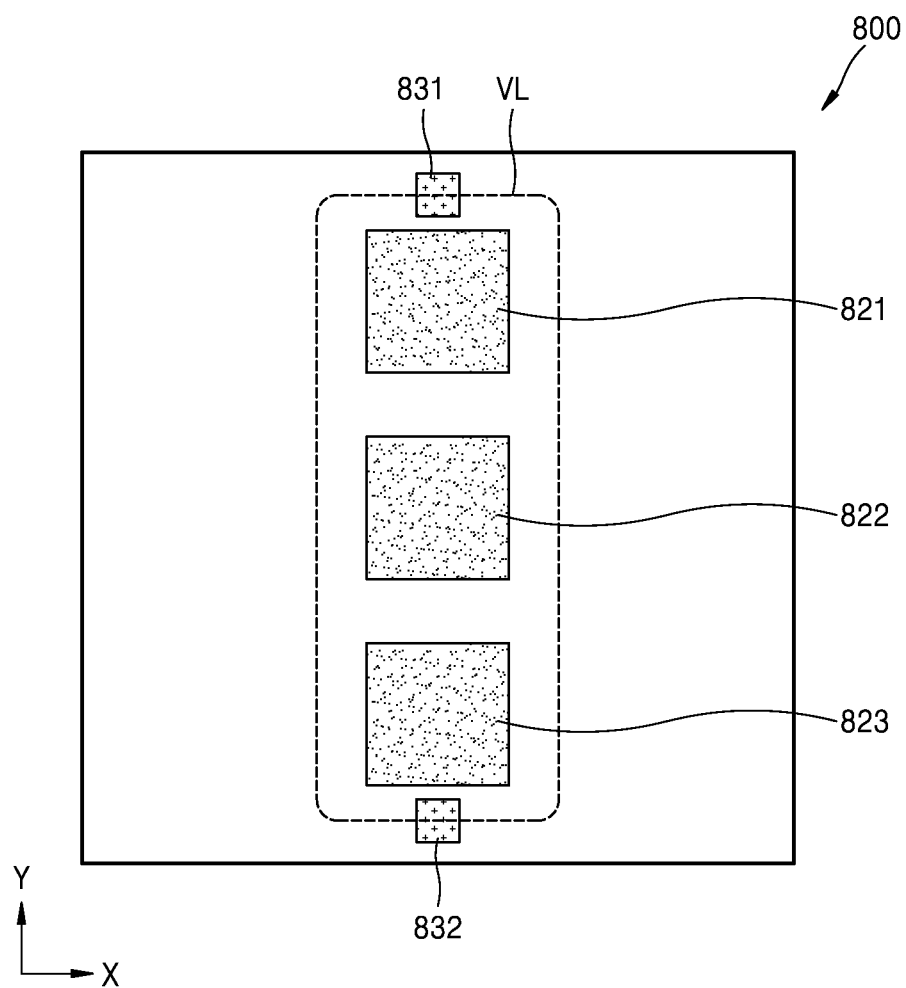
FIG. 19 is a schematic plan view illustrating an electric circuit according to an embodiment.

FIG. 19 is a schematic plan view illustrating an electric circuit according to an embodiment.

Referring to FIG. 19, an electric circuit 800 of the present embodiment may include an active layer 810, first to third application electrodes 821 to 823, a variable low resistance region VL, and connection electrode portions 831 and 832.

The active layer 810 may include a spontaneous polarization material. For example, the active layer 810 may include an insulating material and a ferroelectric material. That is, the active layer 810 may include a material having a spontaneous electric polarization (electric dipole) that may be reversed in the presence of an electric field.

A description of a material for forming the active layer 810 is the same as or modified from that of the above-described embodiment, and thus, a detailed description thereof will be omitted.

Each of the first to third application electrodes 821 to 823 may be formed to apply an electric field to the active layer 810, and may apply, for example, a voltage to the active layer 810.

In an alternative embodiment, the first to third application electrodes 821 to 823 may each be formed to be in contact with an upper surface of the active layer 810, and the first application electrode 821, the second application electrode 822, and the third application electrode 823 may be disposed to be spaced apart from each other.

A description of a material for forming the first to third application electrodes 821 to 823 is the same as or modified from the application electrode of the above-described embodiment, and thus, a detailed description thereof will be omitted.

The connection electrode portions 831 and 832 may include at least one electrode member, for example, a first connection electrode member 831 and a second connection electrode member 832.

The connection electrode portions 831 and 832 may be formed on the active layer 810, for example, may be formed on the upper surface of the active layer 810 to be spaced apart from the application electrode 820, and in an alternative embodiment, the connection electrode portions 831 and 832 may be formed to be in contact with the active layer 810.

The first connection electrode member 831 and the second connection electrode member 832 may each be made of various conductive materials. The first connection electrode member 831 and the second connection electrode member 832 may be the same as or modified from the connection electrode portion of the above-described embodiment, and thus a detailed description thereof will be omitted.

FIG. 19 a view illustrating a state in which an electric field is applied through the first to third application electrodes 821 to 823.

For example, referring to FIG. 19, FIG. 19 may be a view illustrating a state in which a voltage may be applied to the active layer 810 through the first application electrode 821, a voltage may be applied to the active layer 810 through the second application electrode 822, and a voltage may be applied to the active layer 810 through the third application electrode 823.

A polarization region through the first application electrode 821, a polarization region through the second application electrode 822, and a polarization region through the third application electrode 822 may overlap each other, and accordingly, variable low resistance regions may also overlap each other to form one variable low resistance region VL.

In an alternative embodiment, an inner side region of the variable low resistance region VL may be a region in which the polarization region through the first application electrode 821, the polarization region through the second application electrode 822, and the polarization region through the third application electrode 822 overlap each other.

The variable low resistance region VL may form a current path.

The connection electrode portions 831 and 832 correspond to the variable low resistance region VL, and the flow of current may occur in the connection electrode portions 831 and 832.

In an electric circuit of the present embodiment, voltages of various magnitudes may be applied to an active layer through a plurality of application electrodes, and an application time may be controlled.

Accordingly, polarization regions each having a desired size may be formed in the active layer, and the polarization regions may be controlled to overlap each other.

A variable low resistance region may be formed at a boundary of the overlapping polarization region to correspond to a side surface of the active layer.

With such a variable low resistance region, current flow may be formed in various regions of the active layer.

The present disclosure has been described with reference to the examples illustrated in the drawings, but these are only examples. It will be understood by those skilled in the art that various modifications and equivalent other examples may be made. Therefore, the scope of the present disclosure is defined by the appended claims.

The particular implementations shown and described herein are illustrative examples of the embodiments and are not intended to otherwise limit the scope of the embodiments in any way. In addition, no item or element is essential to the practice of the present disclosure unless the element is specifically described as "essential" or "critical".

The use of the terms "a" and "an" and "the" and similar referents in the context of describing the present disclosure (especially in the context of the following claims) are to be construed to cover both the singular and the plural. Further, recitation of ranges of values herein are merely intended to serve as a shorthand method of referring individually to each separate value falling within the range, unless otherwise indicated herein, and each separate value is incorporated into the specification as if it were individually recited herein. Finally, operations of all methods described herein can be performed in any suitable order unless otherwise indicated herein or otherwise clearly contradicted by context. The present disclosure is not limited to the described order of the operations. The use of any and all examples, or exemplary terms (e.g., "such as") provided herein, is intended merely to better illuminate the present disclosure and does not pose a limitation on the scope of the present disclosure unless otherwise claimed. Also, numerous modifications and adaptations will be readily apparent to one of ordinary skill in the art without departing from the spirit and scope of the present disclosure.

INDUSTRIAL APPLICABILITY

One aspect of the present disclosure provides a method of controlling a current path range using an electric field is disclosed, the method including applying an electric field to an active layer including a spontaneous polarization material through an application electrode disposed adjacent to the active layer to form a polarization region of the active layer, and forming a variable low resistance region corresponding to a boundary of the polarization region, wherein the variable low resistance region is a region of the active layer having a lower electrical resistance than another region of the active layer adjacent to the variable low resistance region and allows an electrical path to be formed.

The invention claimed is:

1. A method of controlling a current path range using an electric field, the method comprising:
    applying an electric field to an active layer including a spontaneous polarization material through an application electrode disposed adjacent to the active layer to form a polarization region of the active layer; and
    forming a variable low resistance region corresponding to a boundary of the polarization region,
    wherein the variable low resistance region is a region of the active layer having a lower electrical resistance than another region of the active layer adjacent to the variable low resistance region and allows an electrical path to be formed,
    the polarization region is formed to correspond to a total thickness of the active layer in a thickness direction of the active layer,
    the variable low resistance region is formed along the polarization region so as to correspond to the total thickness of the active layer in the thickness direction of the active layer,
    the variable low resistance region is not in contact with the application electrode,
    an edge of the variable low resistance region is formed so as not to overlap the application electrode in the thickness direction of the active layer,
    wherein the electric field through the application electrode is controlled to control the generation and disappearance of the variable low resistance region and accordingly to control the generation and disappearance of the electrical path.

2. The method of claim 1, wherein the forming of the variable low resistance region comprises:
    growing the polarization region of the active layer in a thickness direction of the active layer; and
    growing the polarization region in a direction crossing the thickness direction of the active layer.

3. The method of claim 1, wherein the forming of the variable low resistance region comprises applying the electric field having an intensity greater than a coercive field of the active layer through the application electrode.

4. The method of claim 1, wherein, in the forming of the variable low resistance region, an intensity of the electric field through the application electrode is controlled to control a depth of the variable low resistance region in a thickness direction of the active layer.

5. The method of claim 1, wherein, in the forming of the variable low resistance region, the variable low resistance region is formed to be spaced apart from the application electrode with a distance in a plane direction of the active layer.

6. The method of claim 1, wherein, in the forming of the variable low resistance region, an application time of the electric field through the application electrode is controlled to control a size or width of the variable low resistance region.

7. The method of claim 1, wherein the forming of the variable low resistance region comprises forming a plurality of variable low resistance regions disposed to be spaced apart from each other.

8. The method of claim 7, wherein in the forming of the plurality of variable low resistance regions, from among the plurality of variable low resistance regions, a variable low resistance region disposed farther from the application electrode first is formed, and then, a variable low resistance region disposed closer to the application electrode is formed.

9. The method of claim 7, wherein the forming of the plurality of variable low resistance regions is performed such that polarization regions having different directions are located on opposite sides of one variable low resistance region with the one variable low resistance region as a boundary.

10. The method of claim 1, wherein
    the application electrode is provided in plural numbers spaced apart from each other, and the method comprising:
forming polarization regions, which are spaced apart from at least one region, in the active layer through the plurality of application electrodes; and
forming a plurality of variable low resistance regions corresponding to the polarization regions.

11. The method of claim 10, comprising:
by controlling an application time of the electric field applied through the application electrode,
overlapping the plurality of polarization regions, which are spaced apart from each other, in one region; and
integrating regions of the plurality of variable low resistance regions corresponding to the plurality of polarization regions by overlapping each other.

12. The method of claim 1, comprising forming at least one connection electrode to be adjacent to the variable low resistance region.

13. The method of claim 1, wherein, even when the electric field applied through the application electrode is removed, the variable low resistance region is maintained as the polarization region is maintained.

14. An electric circuit comprising:
an active layer comprising a spontaneous polarization material;
an application electrode disposed adjacent to the active layer;
a polarization region formed in the active layer by applying an electric field to the active layer through the application electrode; and
a variable low resistance region corresponding to a boundary of the polarization region,
wherein the variable low resistance region is a region of the active layer having a lower electrical resistance than another region of the active layer adjacent to the variable low resistance region and allows an electrical path to be formed,
the polarization region is formed to correspond to a total thickness of the active layer in a thickness direction of the active layer,
the variable low resistance region is formed along the polarization region so as to correspond to the total thickness of the active layer in the thickness direction of the active layer,
the variable low resistance region is not in contact with the application electrode, and
an edge of the variable low resistance region is formed so as not to overlap the application electrode in the thickness direction of the active layer,
wherein an application time of the electric field through the application electrode is controlled to control a size or width of the variable low resistance region.

15. The electric circuit of claim 14, wherein the variable low resistance region is generated or disappeared by controlling the electric field applied through the application electrode and accordingly controlling the polarization region.

16. The electric circuit of claim 14, wherein an intensity of the electric field through the application electrode is controlled to control a depth of the variable low resistance region in a thickness direction of the active layer.

17. The electric circuit of claim 14, wherein the variable low resistance region comprises a plurality of variable low resistance regions disposed to be spaced apart from each other.

18. The electric circuit of claim 17, wherein, from among the plurality of variable low resistance regions, a variable low resistance region disposed farther from the application electrode first is formed, and then, a variable low resistance region disposed closer to the application electrode is formed.

19. The electric circuit of claim 17, wherein polarization regions having different directions are formed on opposite sides of one variable low resistance region of the plurality of variable low resistance regions with the one variable low resistance region as a boundary.

20. The electric circuit of claim 14, wherein the application electrode is provided in plural numbers spaced apart from each other.

21. The electric circuit of claim 20, comprising a plurality of polarization regions and a plurality of variable low resistance regions, which are corresponding to the plurality of application electrodes spaced apart from each other.

22. The electric circuit of claim 21, wherein
by controlling an application time of the electric field applied through the application electrode,
the plurality of polarization regions, which are spaced apart from each other, overlap in one region; and
regions of the plurality of variable low resistance regions corresponding thereto are integrated by overlapping each other.

23. The electric circuit of claim 14, further comprising at least one connection electrode formed adjacent to the variable low resistance region.

24. The electric circuit of claim 14, wherein the active layer comprises a ferroelectric material.

25. The electric circuit of claim 14, wherein the application electrode is formed on one surface of the active layer.

26. The electric circuit of claim 14, wherein the application electrode is disposed to be spaced apart from the active layer.

27. The electric circuit of claim 14, wherein the variable low resistance region is maintained even when the electric field applied through the application electrode is removed.

28. The electric circuit of claim 14, wherein the variable low resistance region is formed in the periphery of the application electrode.

29. The electric circuit of claim 14, wherein the variable low resistance region is formed to have a linear shape in the periphery of the application electrode.

* * * * *